US011466381B2

(12) United States Patent
Kishi et al.

(10) Patent No.: US 11,466,381 B2
(45) Date of Patent: Oct. 11, 2022

(54) QUARTZ GLASS CRUCIBLE

(71) Applicant: SUMCO CORPORATION, Tokyo (JP)

(72) Inventors: Hiroshi Kishi, Akita (JP); Kouta Hasebe, Akita (JP); Takahiro Abe, Tokyo (JP); Hideki Fujiwara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/969,134

(22) PCT Filed: Feb. 13, 2019

(86) PCT No.: PCT/JP2019/004974
§ 371 (c)(1),
(2) Date: Nov. 4, 2020

(87) PCT Pub. No.: WO2019/163593
PCT Pub. Date: Aug. 29, 2019

(65) Prior Publication Data
US 2021/0140063 A1 May 13, 2021

(30) Foreign Application Priority Data

Feb. 23, 2018 (JP) .............................. JP2018-030404
Oct. 2, 2018 (JP) .............................. JP2018-187506

(51) Int. Cl.
*C30B 15/10* (2006.01)
(52) U.S. Cl.
CPC .................................... *C30B 15/10* (2013.01)
(58) Field of Classification Search
CPC ......... C03B 20/00; C30B 15/10; C30B 29/06; C30B 35/002
See application file for complete search history.

(56) References Cited

U.S. PATENT DOCUMENTS

2005/0178319 A1    8/2005  Korus et al.
2006/0016389 A1*   1/2006  Holder ................... C30B 15/10
                                                            117/200
(Continued)

FOREIGN PATENT DOCUMENTS

CN    101031675 A    9/2007
JP    H082932 A      1/1996
(Continued)

OTHER PUBLICATIONS

International Search Report (ISR) dated Mar. 26, 2019, issued for International application No. PCT/JP2019/004974. (2 pages).
(Continued)

*Primary Examiner* — Hua Qi
(74) *Attorney, Agent, or Firm* — Law Office of Katsuhiro Arai

(57) ABSTRACT

A quartz glass crucible 1 includes: a quartz glass crucible body 10 having a cylindrical side wall portion 10a, a curved bottom portion 10b, and a corner portion 10c which has a larger curvature than that of the bottom portion 10b and connects the side wall portion 10a and the bottom portion 10b to each other; and an inner-surface coating film 13A which contains a crystallization accelerator and is formed on an inner surface 10i of the quartz glass crucible body 10, in which the inner surface 10i of the quartz glass crucible body 10 is under compressive stress. The quartz glass crucible has high durability even at a high temperature during a single crystal pull-up step and is capable of reducing a generation ratio of pinholes in a silicon single crystal.

9 Claims, 14 Drawing Sheets

(56) References Cited

U.S. PATENT DOCUMENTS

| | | | |
|---|---|---|---|
| 2008/0092804 A1 | 4/2008 | Hansen et al. | |
| 2010/0132608 A1 | 6/2010 | Morikawa et al. | |
| 2011/0289976 A1* | 12/2011 | Brown | C03B 27/06 |
| | | | 65/349 |
| 2014/0352605 A1 | 12/2014 | Fallows et al. | |
| 2016/0108550 A1* | 4/2016 | Sudo | C30B 15/10 |
| | | | 65/17.3 |
| 2017/0137162 A1* | 5/2017 | Kamiya | C03C 3/097 |
| 2019/0145019 A1 | 5/2019 | Kishi et al. | |

FOREIGN PATENT DOCUMENTS

| | | | |
|---|---|---|---|
| JP | H11278855 A | 10/1999 | |
| JP | H11292695 A | 10/1999 | |
| JP | 2002029890 A | 1/2002 | |
| JP | 2003160393 A | 6/2003 | |
| JP | 2005523229 A | 8/2005 | |
| JP | 2007001793 A | 1/2007 | |
| JP | 2008507467 A | 3/2008 | |
| JP | 2010126423 A | 6/2010 | |
| JP | 2010168240 A | 8/2010 | |
| JP | 2010537945 A | 12/2010 | |
| JP | 2012091969 A | 5/2012 | |
| JP | 6025278 B2 | 11/2016 | |
| JP | WO2014192163 A1 | 2/2017 | |
| JP | WO2017110763 A1 | 6/2018 | |
| WO | 2017110762 A1 | 6/2017 | |
| WO | 2017110763 A1 | 6/2017 | |
| WO | 2018055974 A1 | 3/2018 | |

OTHER PUBLICATIONS

A First Office Action issued by the State Intellectual Property Office of China dated Jul. 7, 2021 for Chinese counterpart application No. 201980014589.1 (7 pages).

* cited by examiner

[FIG. 1]
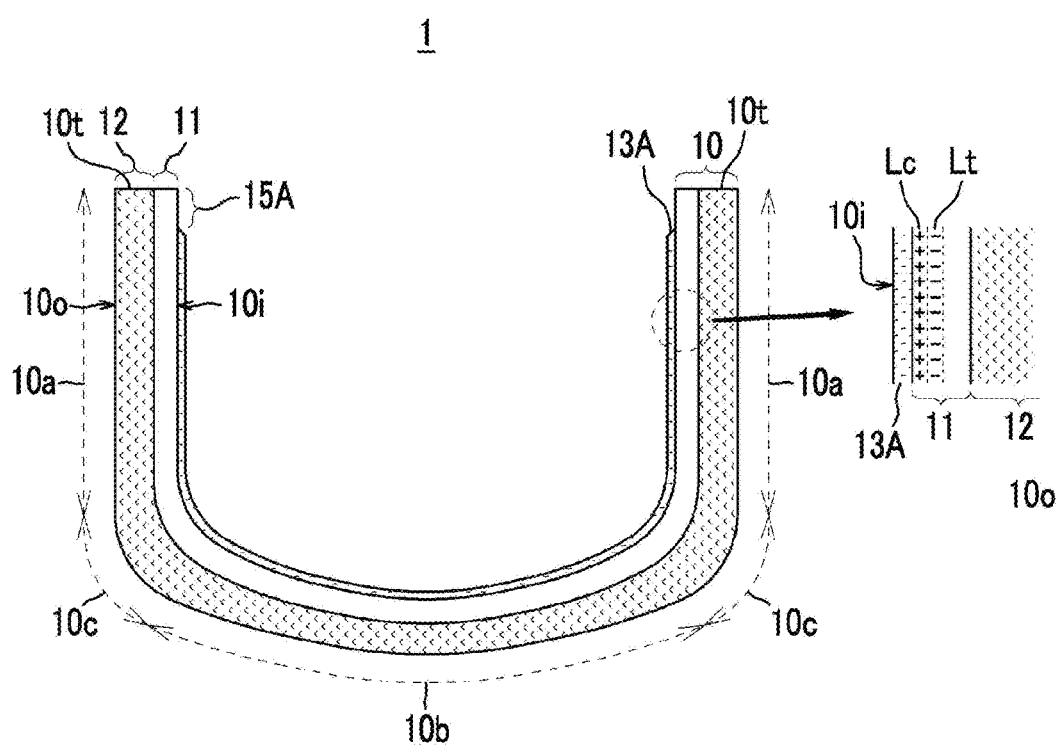

[FIG. 2]
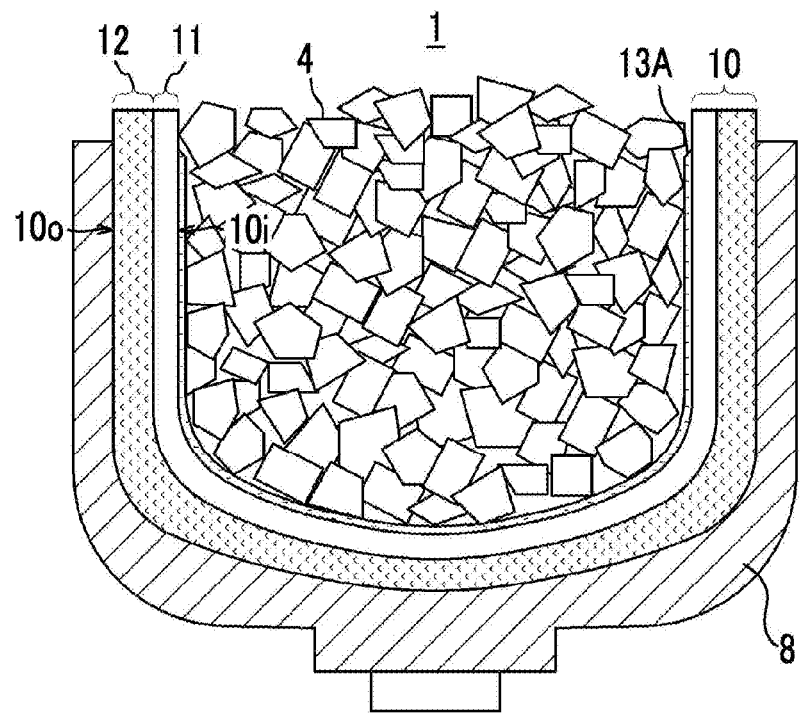
(a)
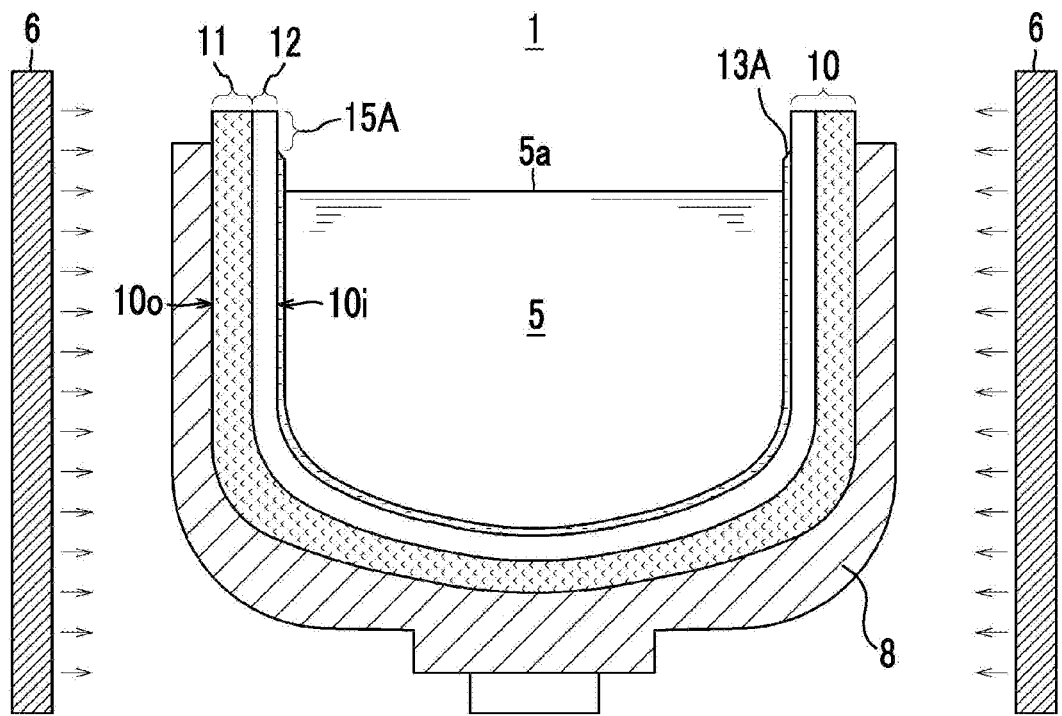
(b)

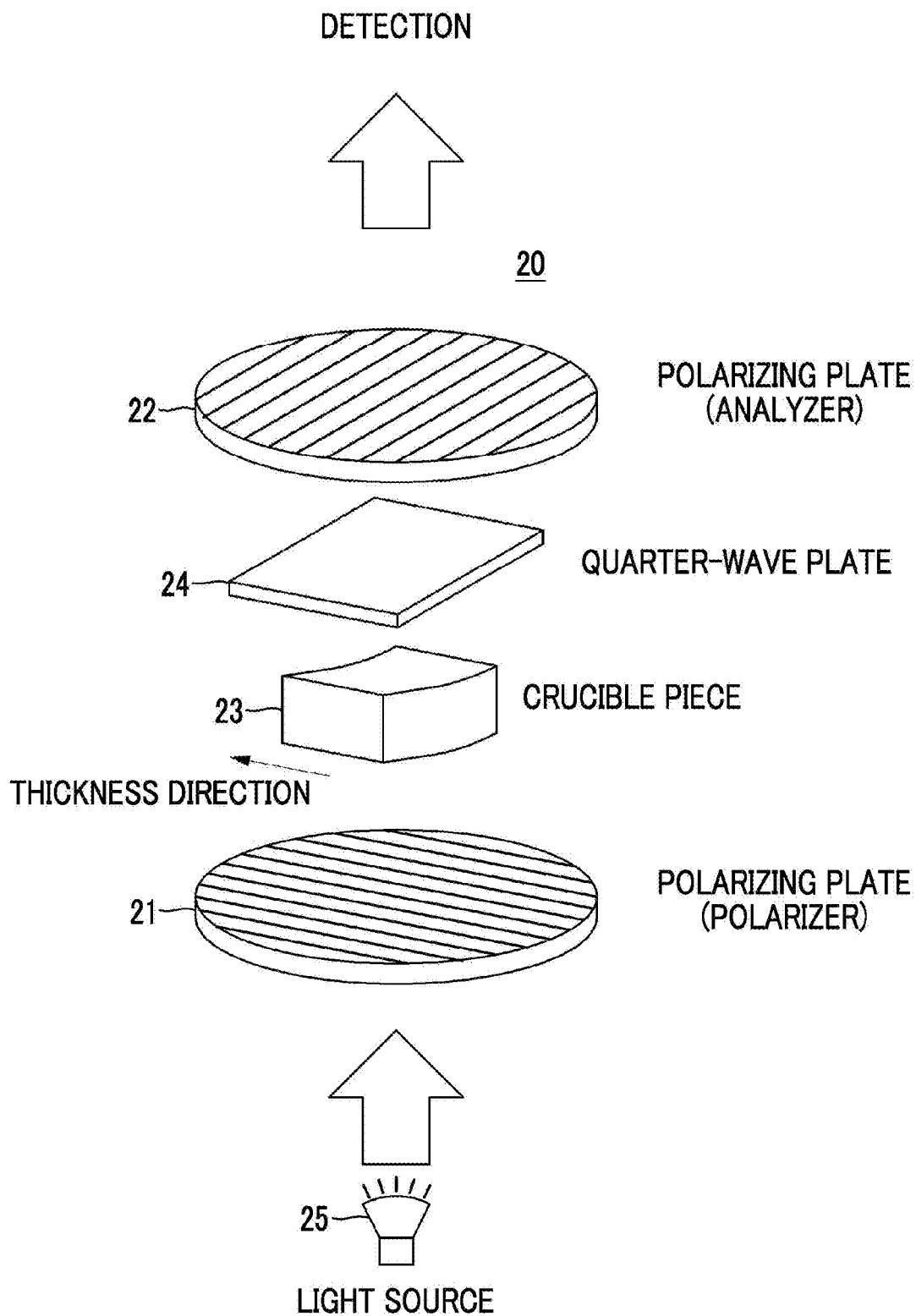
[FIG. 3]

[FIG. 4]
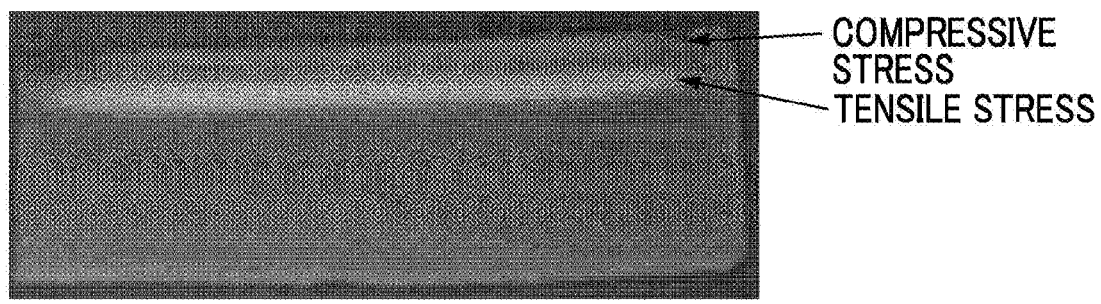
[FIG. 5]
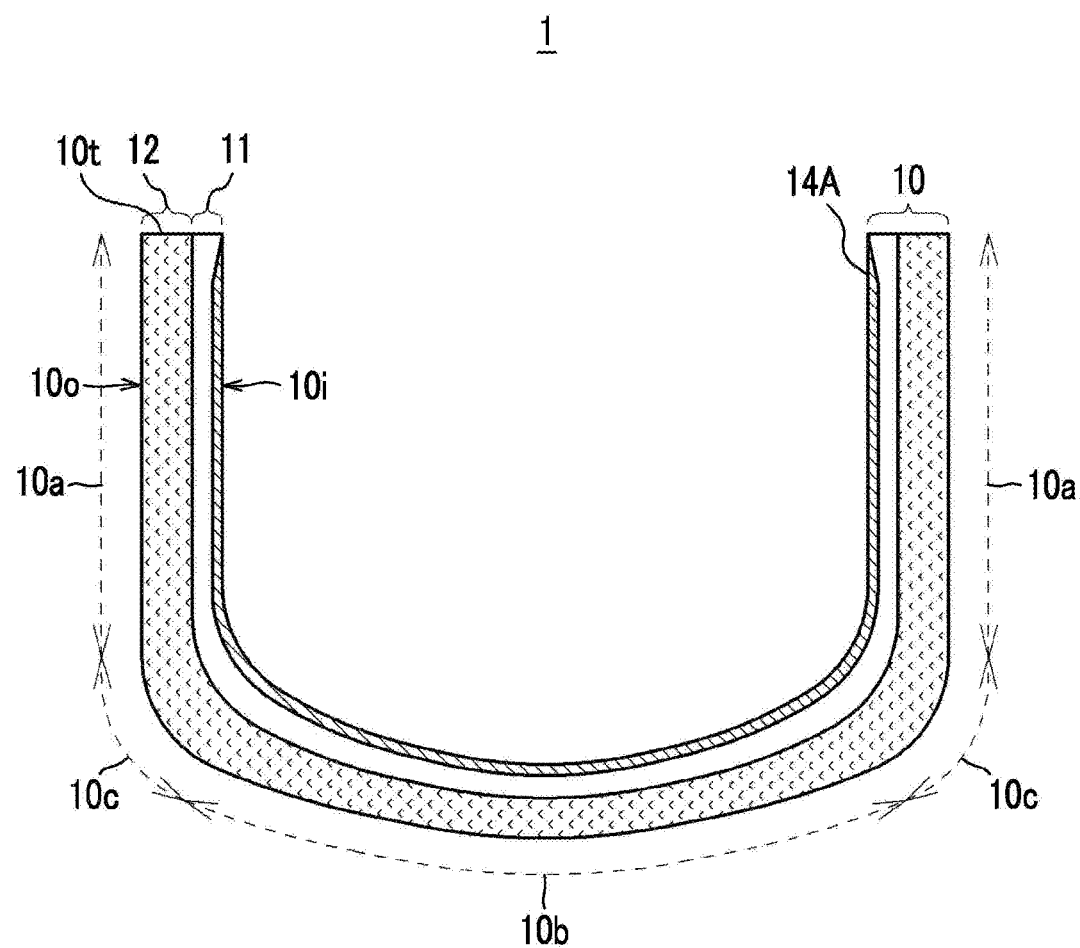

[FIG. 6]
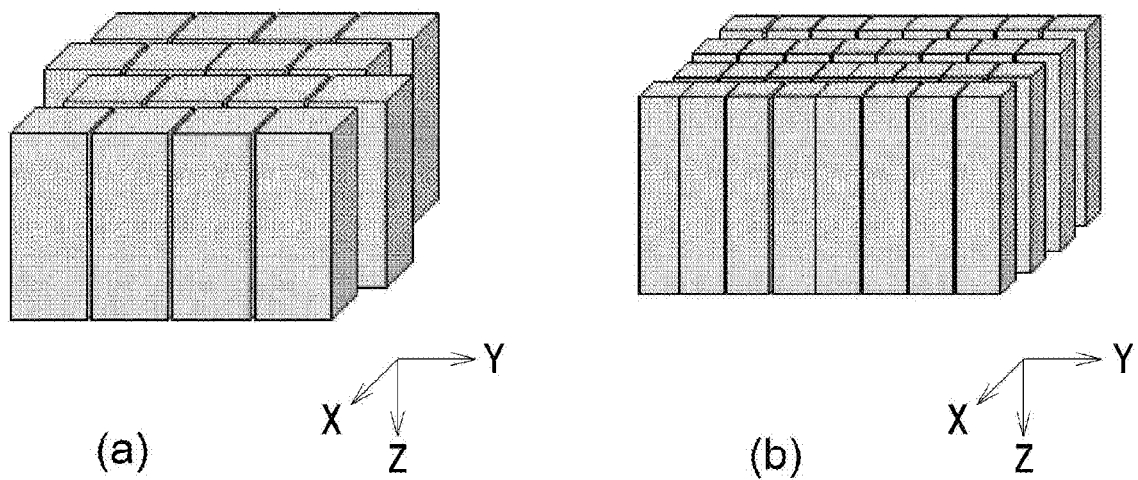
(a)  (b)
[FIG. 7]
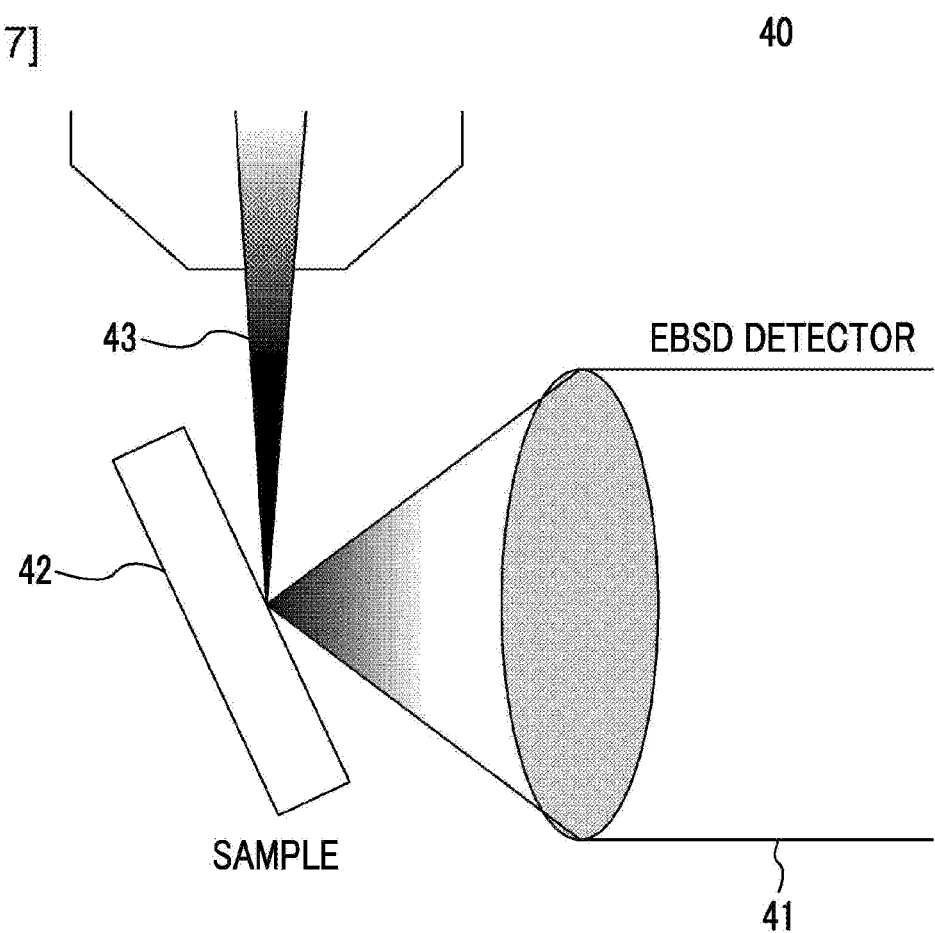

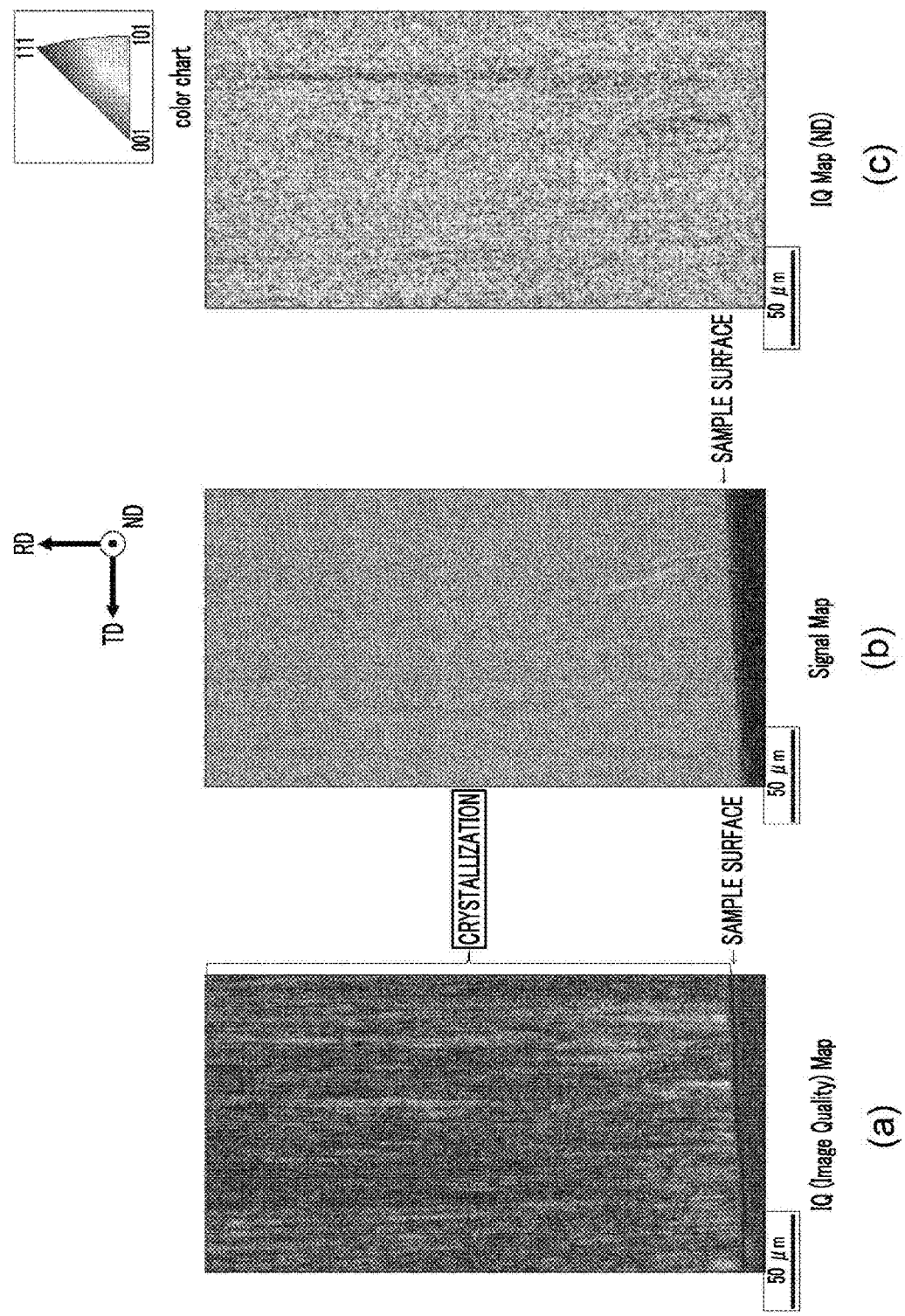
[FIG. 8]

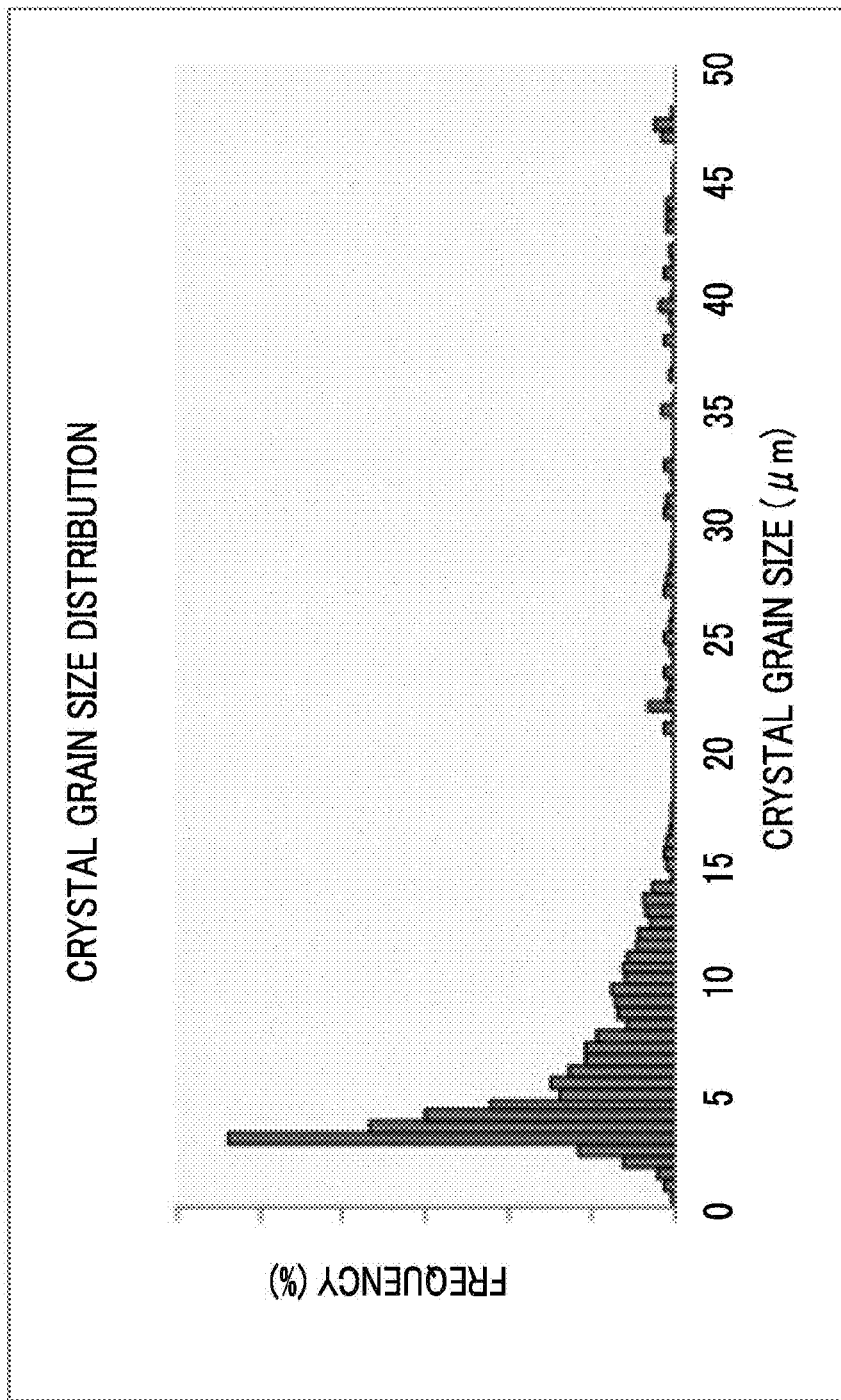
[FIG. 9]

[FIG. 10]
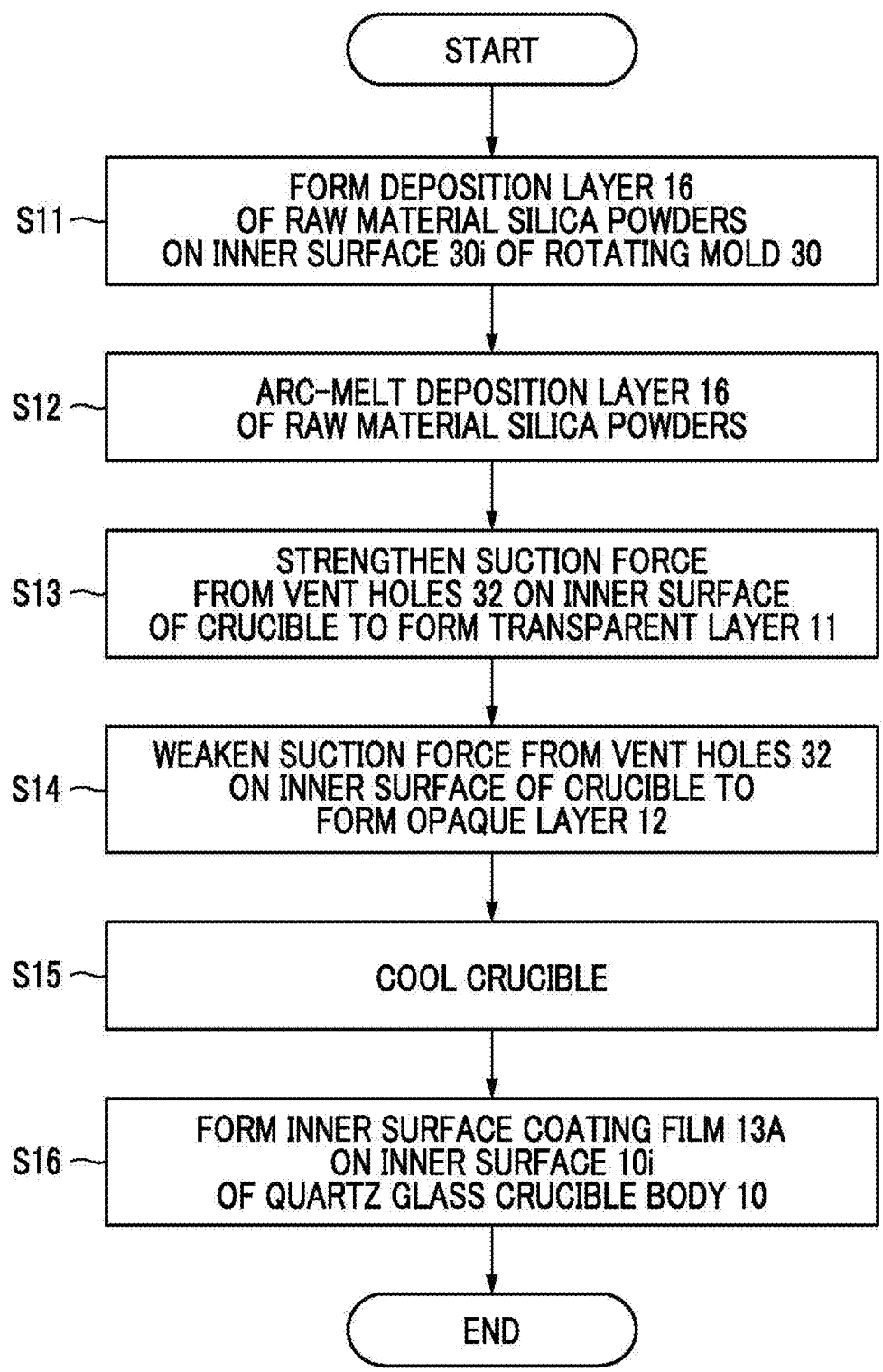

[FIG. 11]
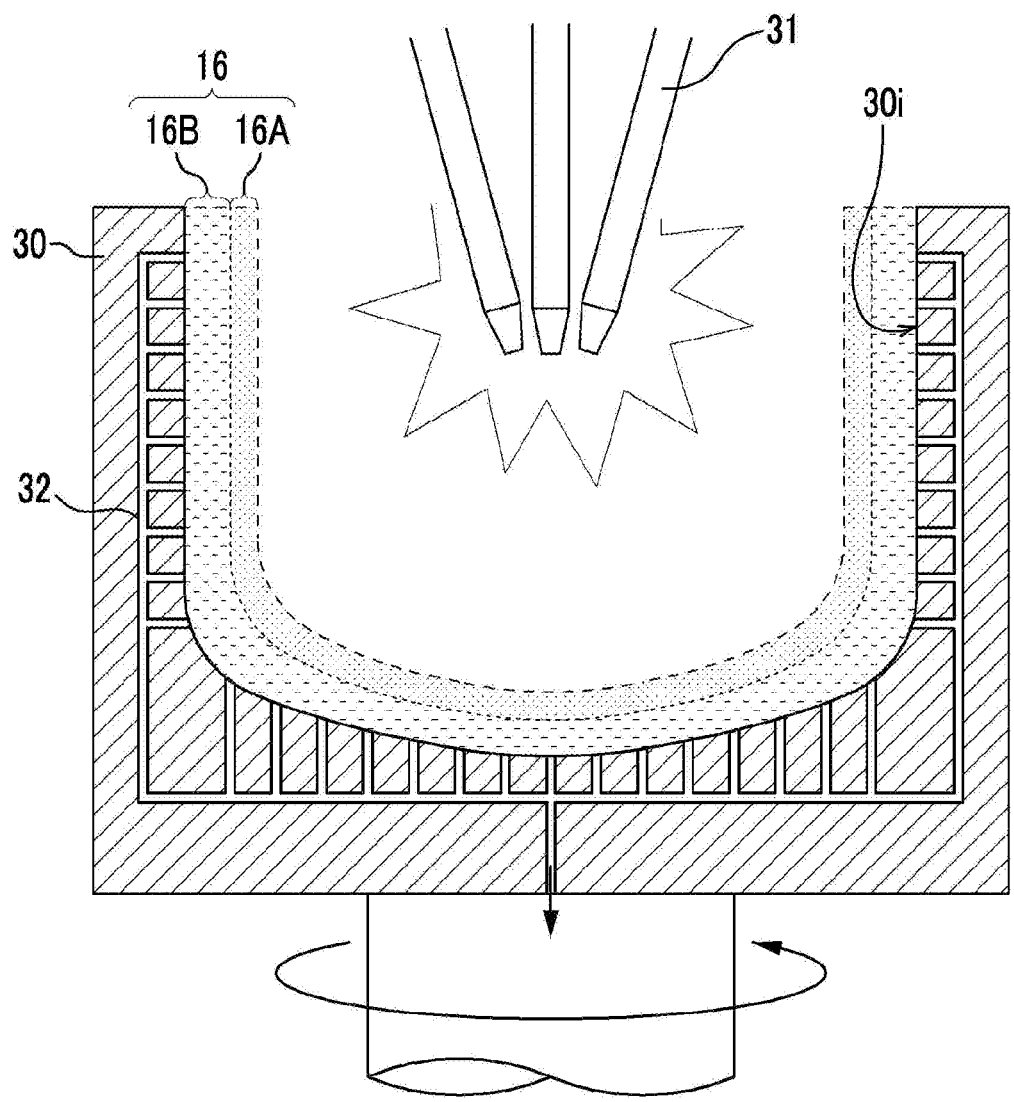

[FIG. 12]
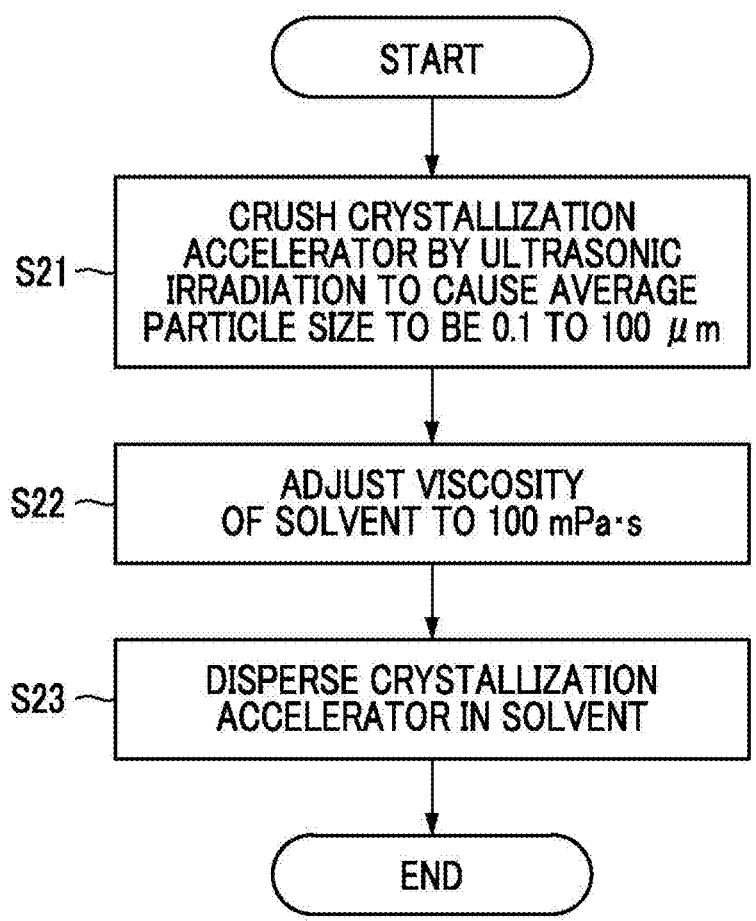

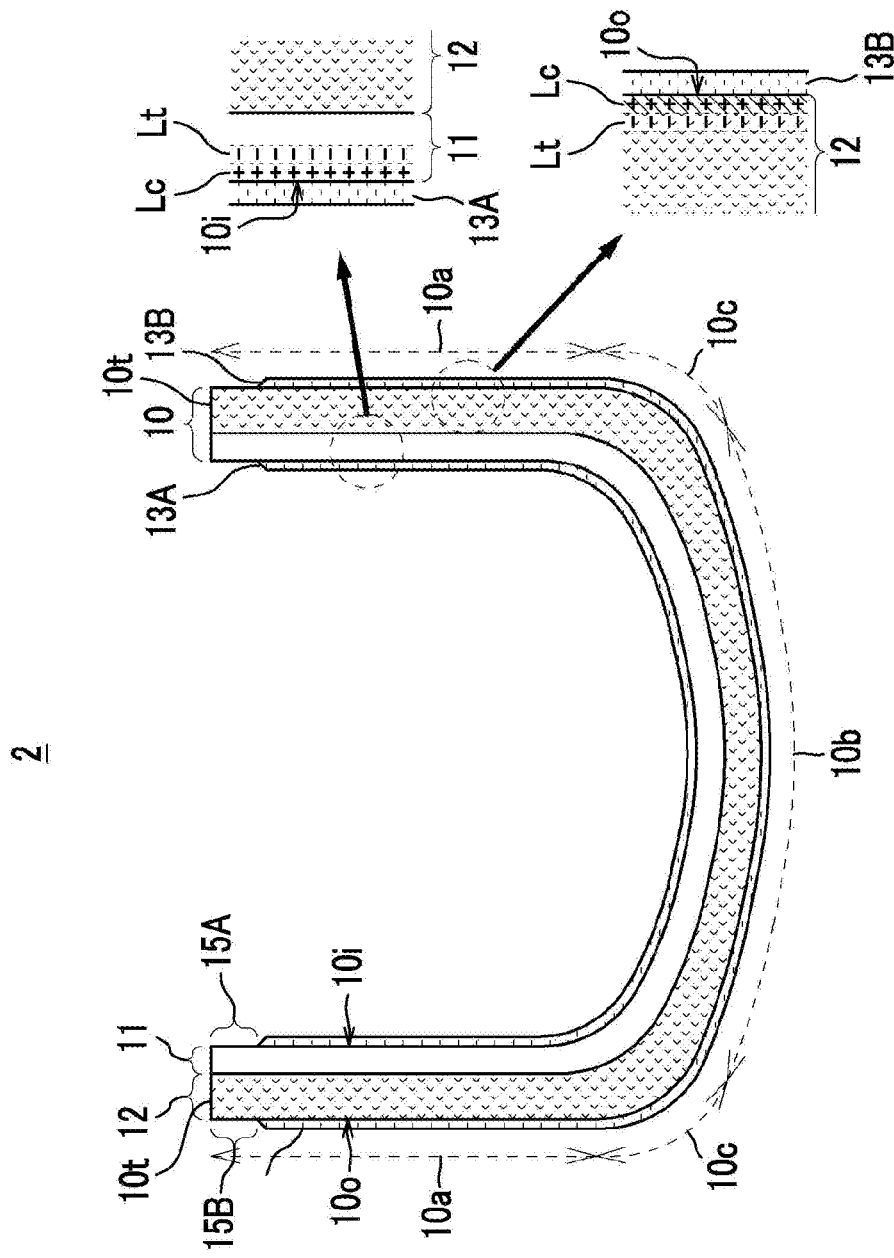
[FIG. 13]

[FIG. 14]
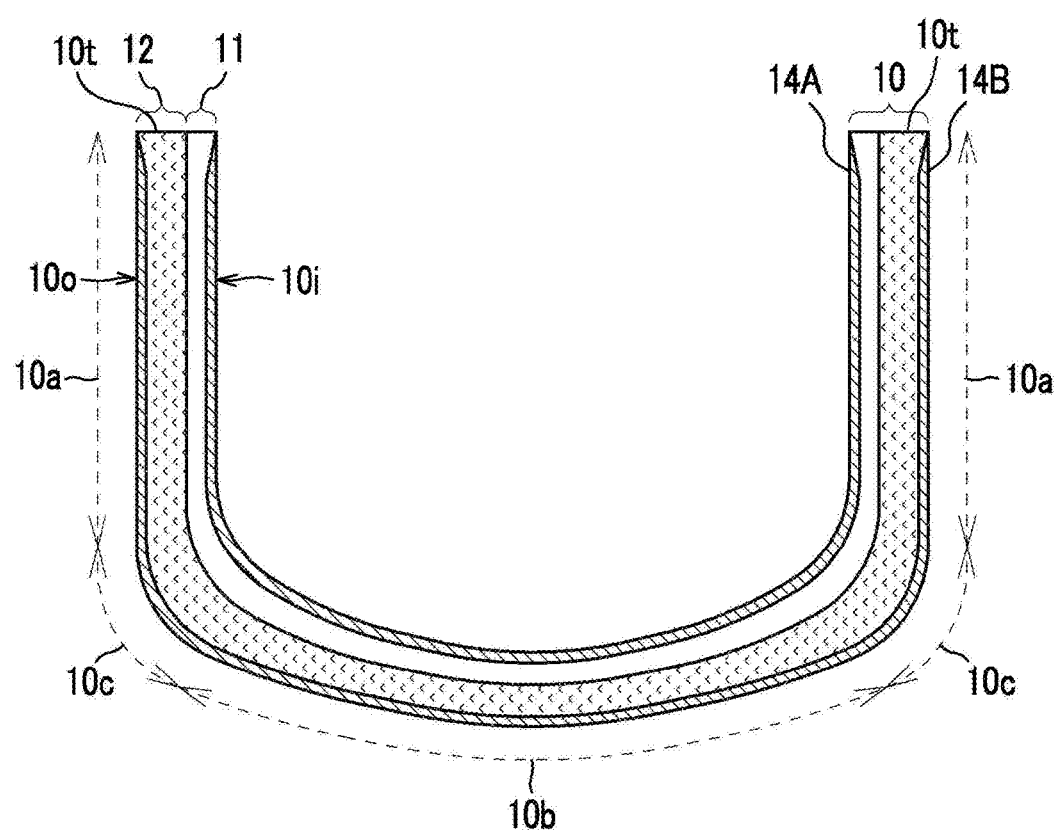

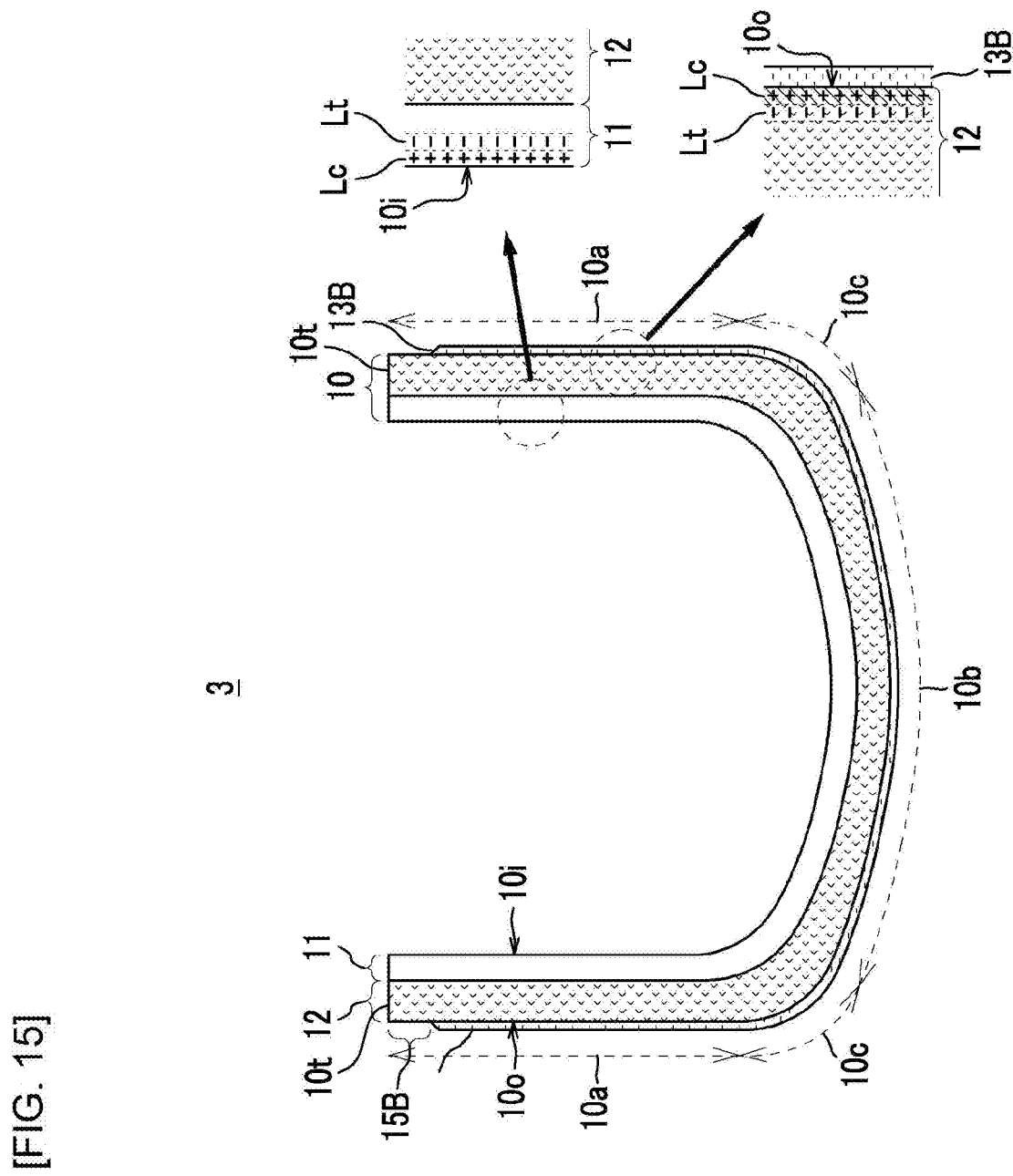
[FIG. 15]

[FIG. 16]
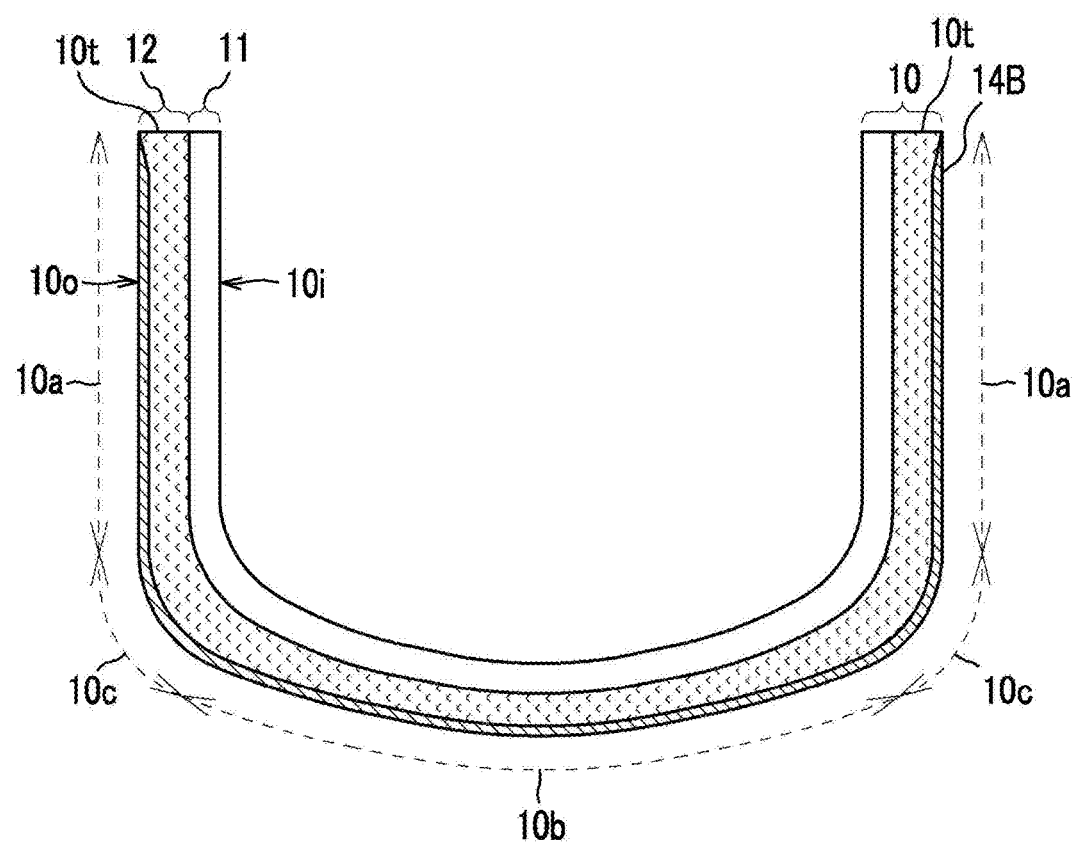

QUARTZ GLASS CRUCIBLE

CROSS-REFERENCE TO RELATED APPLICATIONS

This application is the U.S. National Phase under 35 U.S.C. § 371 of International Application PCT/JP2019/004974, filed Feb. 13, 2019, which claims priority to Japanese Patent Application No. JP2018-030404, filed Feb. 23, 2018. The International Application was published under PCT Article 21(2) in a language other than English.

TECHNICAL FIELD

The present invention relates to a quartz glass crucible and, particularly to a quartz glass crucible used for manufacturing a silicon single crystal by the Czochralski method (CZ method) and a method of manufacturing the same.

BACKGROUND ART

A quartz glass crucible (silica glass crucible) is used for manufacturing a silicon single crystal by the CZ method. In the CZ method, a polycrystalline silicon raw material is heated and melted in the quartz glass crucible, a seed crystal is dipped into the silicon melt, and then the seed crystal is gradually pulled up while rotating the crucible to grow a single crystal. In order to manufacture a high-quality silicon single crystal for a semiconductor device at low cost, it is necessary to perform so-called multi-pulling in which not only can the yield of single crystals be increased using a single pull-up step, but also a plurality of silicon single crystal ingots can be pulled up from a single crucible. For this, a crucible having a stable shape capable of withstanding long-term use is necessary.

In a quartz glass crucible of the related art, viscosity is reduced in a thermal environment at 1400° C. or higher during pulling a silicon single crystal, so that the shape thereof cannot be maintained and deformation of the crucible such as sagging or collapse to the inside occurs. Accordingly, variations in the melt surface level of a silicon melt, breakage of the crucible, contact with components in a furnace, and the like become problems. Furthermore, the inner surface of the crucible is crystallized by coming into contact with the silicon melt during pulling a single crystal, and cristobalite called a brown ring is formed. In a case where the cristobalite delaminates and is incorporated into the silicon single crystal during growth, this causes dislocation.

In order to solve such problems, a method of increasing the strength of a crucible by actively crystallizing the wall surface of the crucible is proposed. For example, Patent Document 1 describes a quartz glass crucible in which a coating film of a crystallization accelerator of elements in group 2a is present within a depth of 1 mm from the inner surface of the quartz glass crucible.

In addition, Patent Document 2 describes that a devitrification accelerator such as a barium hydroxide aqueous solution is applied to the inner surface of a crucible, and the concentration of the devitrification accelerator is adjusted for each part of the crucible so as to cause the crystallization rates of a corner portion, a wall portion, and a bottom portion to be in descending order, thereby preventing delamination of crystals.

Patent Document 3 describes that the outer layer of a side wall of a quartz glass crucible is formed as a doped region which contains a first component such as Ti acting as a reticulating agent in quartz glass and a second component such as Ba acting as a separation point-forming agent in the quartz glass and has a thickness of 0.2 mm or more, cristobalite is formed in the doped region when heated during crystal pulling to accelerate the crystallization of the quartz glass, thereby increasing the strength of the crucible.

Patent Document 4 describes a surface treatment method of a quartz glass product such as a quartz glass crucible, in which the inner surface of a crucible is coated with a reducing coating agent (amines, organosilane halogens, or the like) containing a methyl group to accelerate cristobalite formation during crystal pulling, thereby preventing delamination of a devitrification point.

Patent Document 5 describes a quartz crucible having a crystalline film with a thickness of 0.01 to 50 µm on the inner surface of the quartz crucible, the film having a melting point higher than that of silicon. The crystal grain size of the crystalline film is 0.005 to 1 µm, and the composition of the crystalline film is a compound of titanium and carbon and/or nitrogen and/or titanium, and is formed on the inner surface of the quartz crucible by a PVD method.

Patent Document 6 describes a method of manufacturing a silicon single crystal using a quartz crucible in which the inner surface side of the quartz crucible is charged and barium carbonate is uniformly adhered to the surface.

Patent Document 7 describes a quartz glass crucible transparent layer in order to prevent bubbles generated from the inner surface of the quartz glass crucible from floating in a silicon melt and being incorporated into a silicon single crystal. Patent Document 8 describes a quartz glass crucible in which the internal residual stress of a transparent layer gradually changes from compressive stress to tensile stress from the inside toward the outside so that deformation is suppressed even when used under a high temperature condition for a long period of time. Furthermore, Patent Document 9 describes a strain measuring device for measuring such an internal residual stress.

In recent years, with the increase in the diameter of a silicon single crystal to be pulled up, the problem of incorporation of bubbles in the growing single crystal and generation of pinholes in the single crystal has become noticeable. Pinholes are spherical cavity defects (voids) also called air pockets, and mostly have a size of 300 to 500 µm. However, some are as small as 150 µm or less, or as extremely large as 1 mm or more. It is considered that the cause of pinholes is a gas such as Ar gas dissolved in a silicon melt, or SiO gas generated by a reaction between a quartz crucible and the silicon melt. The gas dissolved in the silicon melt agglomerates at irregularities formed on the inner surface of the crucible as the origins to form bubbles, the bubbles detach from the attaching surface, float in the silicon melt, and are incorporated into the growing single crystal, whereby pinholes are formed in the single crystal. Pinholes can only be detected by cutting a wafer from an ingot and appear as penetrating or non-penetrating holes on the surface or inside of the wafer.

In order to prevent the generation of pinholes, for example, Patent Document 10 describes a quartz glass crucible provided with a highly wettable region within a certain range from the center of the bottom portion of the inner surface of the crucible. In addition, Patent Document 11 describes that an inner surface of a side wall portion has an uneven surface, an inner surface of a bottom portion has a smooth surface, and bubbles of SiO gas are positively generated from the inner surface of the side wall portion such that bubbles are not incorporated into the silicon single crystal during pulling.

BACKGROUND ART DOCUMENT

Patent Documents

Patent Document 1: Japanese Patent Application Laid-Open No. H8-2932
Patent Document 2: Japanese Patent Application Laid-Open No. 2003-160393
Patent Document 3: Japanese Patent Application Laid-Open No. 2005-523229
Patent Document 4: Japanese Patent Application Laid-Open No. 2010-537945
Patent Document 5: Japanese Patent Application Laid-Open No. H11-292695
Patent Document 6: Japanese Patent Application Laid-Open No. 2007-1793
Patent Document 7: Japanese Patent Application Laid-Open No. H11-278855
Patent Document 8: Japanese Patent No. 6025278
Patent Document 9: International Publication No. WO2017/110763 pamphlet
Patent Document 10: Japanese Patent Application Laid-Open No. 2010-168240
Patent Document 11: Japanese Patent Application Laid-Open No. 2010-126423

SUMMARY OF THE INVENTION

Problems to be Solved by the Invention

As described above, according to the quartz glass crucible having the inner surface coated with the crystallization accelerator, it is possible to positively crystallize the inner surface during the crystal pull-up step, thereby increasing durability of the crucible. However, even in a case where a silicon single crystal is pulled up using such a crucible, pinholes may be generated in the single crystal, and a reduction in the pinhole generation ratio is required.

In the crucible strengthening methods of the related art described in Patent Documents 1 and 2, there are cases where the thickness of a crystal layer is insufficient, and crystal grains may be delaminated depending on the crystallization state. That is, when the orientation of the crystal layer is weakened, the crystallization accelerator is trapped in the crystal grain boundary, and the crystallization rate decreases with time, so that the crystal growth in the thickness direction of the crucible is stopped in a relatively early stage of a pulling step. Therefore, in the pulling step taken for a very long period of time under high-temperature heat load, such as multi-pulling, there is a problem that a thin crystal layer in the inner surface of the crucible is eroded in the silicon melt and disappears completely.

The method of strengthening a crucible in the related art described in Patent Document 4 focuses only on the density of the brown ring on the surface and does not consider the crystal growth in the thickness direction of the crucible. When the thickness of the crystal layer is not sufficiently secured, there is a problem that the strength of the crucible cannot be maintained and deformation occurs, or delamination of the brown ring generated on the surface of the quartz glass occurs. Furthermore, since the brown ring does not cover the entire inner surface of the crucible, the brown ring does not contribute to an increase in the strength of the crucible.

The method of strengthening a crucible in the related art described in Patent Document 5 uses titanium or a titanium compound as a crystallization accelerator, so that the crystallization acceleration effect cannot be said to be sufficient. Furthermore, in a case where the titanium or titanium compound is formed by the PVD method, there is a problem that the facility is large and the cost is high.

In the method of strengthening a crucible in the related art described in Patent Document 6, barium carbonate is used as a crystallization accelerator, and pulling a single crystal has to be performed while a charged state of the inner surface side of the quartz crucible is maintained, specifically, within five hours after the quartz crucible is charged, so that the handling of the crucible is very troublesome. In addition, since barium carbonate only adheres to the inner surface of the crucible by the force of static electricity, when silicon raw material is loaded into the quartz crucible, barium carbonate is easily delaminated from the inner surface of the crucible due to contact with the silicon raw material, and it is difficult to actually maintain the uniformly adhered state of barium carbonate.

Accordingly, an object of the present invention is to provide a quartz glass crucible capable of reducing a pinhole generation ratio in a silicon single crystal while securing durability at high temperatures during a crystal pull-up step. Another object of the present invention is to provide a quartz glass crucible capable of withstanding a single crystal pull-up step taken for a very long period of time, such as multi-pulling, and a method of manufacturing the same.

Means for Solving the Problems

In order to solve the above problems, a quartz glass crucible according to the present invention includes: a quartz glass crucible body having a cylindrical side wall portion, a curved bottom portion, and a corner portion which has a larger curvature than that of the bottom portion and connects the side wall portion and the bottom portion to each other; and an inner-surface coating film which contains a crystallization accelerator and is formed on an inner surface of the quartz glass crucible body, in which the inner surface of the quartz glass crucible body is under compressive stress.

According to the present invention, the inner surface of the crucible can be crystallized in a state where strain due to compressive stress is not released, so that an inner crystal layer which is denser and stronger than that in the related art and having few irregularities which become the origin of generation of bubbles, can be formed on the surface. In addition, the crystallization rate of quartz glass under compressive stress is higher than the crystallization rate of quartz glass not under compressive stress, so that a thick inner crystal layer can be formed, and the strength of the inner crystal layer can be increased even in terms of thickness. Therefore, it is possible to provide a quartz glass crucible capable of reducing the generation ratio of pinholes in a silicon single crystal while securing durability at a high temperature during a crystal pull-up step.

In the present invention, it is preferable that the inner-surface coating film contains a compound that contains the crystallization accelerator and forms a glass having a two or more component system with $SiO_2$. Accordingly, crystallization of the inner surface of the crucible can be accelerated at 1200° C. or lower at which strain due to compressive stress is not released. Therefore, a dense crystal layer can be formed, and an inner crystal layer which is stronger than that in the related art can be obtained.

In the present invention, it is preferable that an uncoated region of the crystallization accelerator is provided on a rim upper-end surface of the quartz glass crucible body and within a range of 2 to 40 mm extending downward from a rim upper end on the inner surface of the quartz glass crucible body. Accordingly, crystallization of the rim upper-end surface and the inner surface in the vicinity of the rim upper end can be suppressed. Since a rim upper-end portion is more likely to receive stress, in a case where the rim upper-end portion is crystallized, particles are generated due to cracks or the like, and there is concern that the yield of a silicon single crystal may decrease. However, in a case where crystallization of the rim upper-end portion is suppressed, generation of particles from the rim upper-end portion can be suppressed, and the yield of silicon single crystals can be improved. In addition, when a boundary between the inner crystal layer and the glass layer is present at a position within a silicon melt, stress is concentrated on the boundary and particles are easily generated. However, by disposing the upper end of the inner-surface coating film above the melt surface, the generation of particles can be suppressed and the yield of silicon single crystals can be improved.

In the present invention, it is preferable that an average grain size of crystal grains contained in an inner crystal layer formed in a vicinity of the inner surface of the quartz glass crucible body due to an action of the inner-surface coating film heated during a step of pulling a silicon single crystal is 0.1 to 100 μm, a peak of a frequency distribution of the crystal grains is in a range of 0.1 to 100 μm, and a sum of first and second highest ranks in area ratios of respective plane orientations of the inner crystal layer viewed from an inner-surface side of the quartz glass crucible body is 50% or more. Since the crystal grains constituting the crystal layer formed on the surface of the quartz glass crucible body have an appropriate crystal grain size and crystal orientation, crystal growth can be maintained during crystal pulling, and loss of the crystal layer due to delamination or a reaction with the silicon melt can be prevented. Therefore, it is possible to form a crystal layer that is less likely to crack and has high strength even when the thickness is small, and it is possible to suppress deterioration of single crystal yield due to deformation of the crucible. Furthermore, by causing the crystal layer to be in a specific orientation state, delamination of the crystal layer can be prevented, and furthermore, a crystal layer which is dense and has few irregularities can be formed. In a case where a crystal layer which is dense and has few irregularities is formed on the surface of the crucible immediately after the start of crystallization, the crystal layer can easily grow while maintaining a specific orientation state, so that a synergistic effect with compressive stress can be attained. Accordingly, it is possible to enhance the effect of improving durability of the crucible and reducing the pinhole generation ratio in the silicon single crystal.

In the present invention, it is preferable that when texture coefficients Tc of respective plane orientations of an inner crystal layer viewed from an inner-surface side of the quartz glass crucible body is measured by an X-ray diffraction method, a ratio (Tc occupancy ratio) of first and second highest ranks in the texture coefficients Tc to a sum of the texture coefficients Tc of the respective plane orientations is 50% or more. As described above, since the crystal grains constituting the crystal layer have an appropriate crystal grain size and crystal orientation, it is possible to form a crystal layer that is less likely to crack and has high strength even when the thickness is small, and it is possible to suppress deterioration of single crystal yield due to deformation of the crucible. Furthermore, a synergistic effect with compressive stress can be attained. Accordingly, it is possible to enhance the effect of improving durability of the crucible and reducing the pinhole generation ratio in the silicon single crystal.

It is preferable that the quartz glass crucible according to the present invention may further include an outer-surface coating film which contains crystallization accelerator and is formed on an outer surface of the quartz glass crucible body, in which the outer surface of the quartz glass crucible body is under compressive stress. Accordingly, the outer surface of the crucible can be crystallized in a state where strain due to compressive stress is not released, so that an outer crystal layer which is denser and stronger than that in the related art can be obtained. In addition, the crystallization rate of quartz glass under compressive stress is higher than the crystallization rate of quartz glass not under compressive stress, so that a thick outer crystal layer can be formed, and the strength of the outer crystal layer can be increased even in terms of thickness. Therefore, deformation of the crucible can be suppressed, and yield of silicon single crystals can be improved.

In the present invention, it is preferable that the outer-surface coating film contains a compound that contains the crystallization accelerator and forms a glass having a two or more component system with $SiO_2$. Accordingly, crystallization of the outer surface of the crucible can be accelerated at 1200° C. or lower at which strain due to compressive stress is not released. Therefore, a dense crystal layer can be formed, and an outer crystal layer which is stronger than that in the related art can be obtained.

In the present invention, it is preferable that an uncoated region of crystallization accelerator is provided within a range of 2 to 40 mm extending downward from a rim upper end on the outer surface of the quartz glass crucible body. Accordingly, crystallization of the outer surface in the vicinity of the rim upper end can be suppressed. Therefore, generation of particles from the rim upper-end portion can be suppressed, and yield of silicon single crystals can be improved.

In the present invention, it is preferable that a bubble content in a vicinity of the outer surface of the quartz glass crucible body is 0.8% or more and 5% or less. Accordingly, even in a case where the outer surface of the quartz glass crucible body is crystallized by the crystallization accelerator, foaming and delamination of the outer crystal layer due to bubbles included in the vicinity of the outer surface can be prevented.

In the present invention, it is preferable that an average grain size of crystal grains contained in an outer crystal layer formed in a vicinity of the outer surface of the quartz glass crucible body due to an action of the outer-surface coating film heated during a step of pulling up a silicon single crystal is 0.1 to 100 μm, a peak of a frequency distribution of the crystal grains is in a range of 0.1 to 100 μm, and a sum of first and second highest ranks in area ratios of respective plane orientations of the outer crystal layer viewed from an outer surface side of the quartz glass crucible body is 50% or more. Since the crystal grains constituting the crystal layer formed on the surface of the quartz glass crucible body have an appropriate crystal grain size and crystal orientation, crystal growth can be maintained during crystal pulling, and loss of the crystal layer due to delamination or a reaction with the silicon melt can be prevented. Therefore, it is possible to form a crystal layer that is less likely to crack and has high strength even when the thickness is small, and it is possible to suppress deterioration of single crystal yield due to deformation of the crucible. Furthermore, by causing the crystal layer to be in a specific orientation state, delamination of the crystal layer can be prevented, and furthermore, a crystal layer which is dense and has few irregularities can be formed. In a case where a crystal layer which is dense and has few irregularities is formed on the surface of the crucible immediately after the start of crystallization, the crystal layer can easily grow while maintaining a specific orientation state, so that a synergistic effect with compressive stress can be attained. Accordingly, it is possible to enhance the effect of improving durability of the crucible and reducing the pinhole generation ratio in the silicon single crystal.

In the present invention, it is preferable that when texture coefficients Tc of respective plane orientations of an outer crystal layer viewed from an outer-surface side of the quartz glass crucible body is measured by an X-ray diffraction method, a ratio (Tc occupancy ratio) of first and second highest ranks in the texture coefficients Tc to a sum of the texture coefficients Tc of the respective plane orientations is 50% or more. As described above, since the crystal grains constituting the crystal layer have an appropriate crystal grain size and crystal orientation, it is possible to form a crystal layer that is less likely to crack and has high strength even when the thickness is small, and it is possible to suppress deterioration of single crystal yield due to deformation of the crucible. Furthermore, a synergistic effect with compressive stress can be attained. Accordingly, it is possible to enhance the effect of improving durability of the crucible and reducing the pinhole generation ratio in the silicon single crystal.

In the present invention, it is preferable that an average particle size of the crystallization accelerator is 0.1 to 100 μm, and a peak of a frequency distribution of particle sizes of the crystallization accelerator is in a range of 0.1 to 100 μm.

In the present invention, it is preferable that the quartz glass crucible body includes a transparent layer which is made of a quartz glass containing no bubbles and forms the inner surface of the quartz glass crucible body, and an opaque layer which is made of a quartz glass containing a large number of minute bubbles and is provided on an outside of the transparent layer. As a result, it is possible to increase the yield of silicon single crystals while maintaining durability at a high temperature during the crystal pulling step.

In addition, a quartz glass crucible according to the present invention includes: a quartz glass crucible body having a cylindrical side wall portion, a curved bottom portion, and a corner portion which has a larger curvature than that of the bottom portion and connects the side wall portion and the bottom portion to each other; and an outer-surface coating film which contains a crystallization accelerator and is formed on an outer surface of the quartz glass crucible body, in which the outer surface and an inner surface of the quartz glass crucible body are under compressive stress.

According to the present invention, crystallization of the outer surface of the crucible can be accelerated at 1200° C. or lower at which the strain due to compressive stress is not released, so that an outer crystal layer that is denser and stronger than that in the related art can be obtained. As a result, strength of the inner surface of the crucible is also improved, so that the number of recessed portions such as scratches and indentations formed on the inner surface of the crucible can be reduced, and the depth of the recessed portions can be reduced.

In the present invention, it is preferable that the outer-surface coating film contains a compound that contains the crystallization accelerator and forms a glass having a system of two or more components with SiO2. Accordingly, the crystallization of the inner surface of the crucible can be accelerated at 1200° C. or lower at which strain due to compressive stress is not released. Therefore, a dense crystal layer can be formed, and an outer crystal layer which is stronger than that in the related art can be obtained.

It is preferable that an uncoated region of the crystallization accelerator is provided within a range of 2 to 40 mm extending downward from a rim upper end on the outer surface of the quartz glass crucible body. Accordingly, crystallization of the rim upper-end surface and the inner surface in the vicinity of the rim upper end can be suppressed.

In the present invention, it is preferable that a bubble content in a vicinity of the outer surface of the quartz glass crucible body is 0.8% or more and 5% or less. Accordingly, even in a case where the outer surface of the quartz glass crucible body is crystallized by the crystallization accelerator, foaming and delamination of the outer crystal layer due to bubbles included in the vicinity of the outer surface can be prevented.

In the present invention, it is preferable that an average grain size of crystal grains contained in an outer crystal layer formed in a vicinity of the outer surface of the quartz glass crucible body due to an action of the outer-surface coating film heated during a step of pulling up a silicon single crystal is 0.1 to 100 μm, a peak of a frequency distribution of the crystal grains is in a range of 0.1 to 100 μm, and a sum of first and second highest ranks in area ratios of respective plane orientations of the outer crystal layer viewed from an outer-surface side of the quartz glass crucible body is 50% or more.

In the present invention, it is preferable that when texture coefficients Tc of respective plane orientations of an outer crystal layer viewed from an outer-surface side of the quartz glass crucible body is measured by an X-ray diffraction method, a ratio (Tc occupancy ratio) of first and second highest ranks in the texture coefficients Tc to a sum of the texture coefficients Tc of the respective plane orientations is 50% or more.

In the present invention, it is preferable that an average particle size of the crystallization accelerator is 0.1 to 100 μm, and a peak of a frequency distribution of particle sizes of the crystallization accelerator is in a range of 0.1 to 100 μm. In this case, the crystallization accelerator is particularly preferably barium carbonate. Accordingly, not only can the crystallization of the surface of the crucible body be simply accelerated, but also a crystal layer having an appropriate crystal grain size and crystal orientation can be formed, and crystal growth can be maintained.

Furthermore, a quartz glass crucible according to the present invention is used for pulling up a silicon single crystal by a Czochralski method, and includes: a cylindrical crucible body which has a bottom and is made of quartz glass; and a crystallization-accelerator-containing coating film which is formed on at least one of an inner surface and an outer surface of the crucible body so as to cause a crystal layer to be formed on a surface of the crucible body by heating during a step of pulling up the silicon single crystal, in which an average grain size of crystal grains constituting the crystal layer is 0.1 to 100 μm, a peak of a frequency distribution of the crystal grains is in a range of 0.1 to 100 μm, and a sum of first and second highest ranks in area ratios of respective plane orientations of the crystal layer viewed from a surface side of the crucible body is 50% or more.

According to the present invention, since the crystal grains constituting the crystal layer formed on the surface of the crucible body have an appropriate crystal grain size and crystal orientation, crystal growth can be maintained during crystal pulling, and loss of the crystal layer due to delamination or a reaction with the silicon melt can be prevented. Therefore, it is possible to form a crystal layer that is less likely to crack and has high strength even when the thickness is small, and it is possible to suppress deterioration of single crystal yield due to deformation of the crucible.

In the present invention, it is preferable that the plane orientations accounting for the first and second highest ranks in the area ratio are a (200) plane and a (112) plane. In this case, it is particularly preferable that the area ratio of the (200) plane is larger than the area ratio of the (112) plane. Accordingly, the crystal layer formed on the surface of the crucible body can be provided with an appropriate orientation, and crystal growth can be maintained during crystal pulling, so that loss of the crystal layer due to delamination or a reaction with the silicon melt can be prevented.

In the present invention, it is preferable that when texture coefficients Tc of respective plane orientations of the crystal layer viewed from the surface side of the crucible body is measured by an X-ray diffraction method, a ratio (Tc occupancy ratio) of first and second highest ranks in the texture coefficients Tc to a sum of the texture coefficients Tc of the respective plane orientations is 50% or more. As described above, since the crystal grains constituting the crystal layer have an appropriate crystal grain size and crystal orientation, it is possible to form a crystal layer that is less likely to crack and has high strength even when the thickness is small, and it is possible to suppress deterioration of single crystal yield due to deformation of the crucible.

In the present invention, it is preferable that the plane orientations accounting for the first and second highest ranks in the texture coefficients Tc are a (200) plane and a (112) plane. In this case, it is particularly preferable that the texture coefficient Tc(200) of the (200) plane is larger than the texture coefficient Tc(112) of the (112) plane. Accordingly, the crystal layer can be provided with an appropriate orientation, and crystal growth can be maintained during crystal pulling, so that loss of the crystal layer due to delamination or a reaction with the silicon melt can be prevented.

In the present invention, it is preferable that an average particle size of a crystallization accelerator contained in the crystallization-accelerator-containing coating film is 0.1 to 100 μm, and a peak of a frequency distribution of particle sizes of the crystallization accelerator is in a range of 0.1 to 100 μm. In this case, it is particularly preferable that the crystallization accelerator is barium carbonate. Accordingly, not only can the crystallization of the surface of the crucible body be simply accelerated, but also a crystal layer having an appropriate crystal grain size and crystal orientation can be formed, and crystal growth can be maintained.

In addition, the quartz glass crucible according to the present invention is a quartz glass crucible used for pulling up a silicon single crystal by a Czochralski method, and includes: a cylindrical crucible body which has a bottom and is made of quartz glass; and a crystallization-accelerator-containing coating film which is formed on at least one of an inner surface and an outer surface of the crucible body so as to cause a crystal layer to be formed on a surface of the crucible body by heating during a step of pulling up the silicon single crystal, in which an average grain size of crystal grains constituting the crystal layer is 0.1 to 100 μm, a peak of a frequency distribution of the crystal grains is in a range of 0.1 to 100 μm, and when texture coefficients Tc of respective plane orientations of the crystal layer viewed from a surface side of the crucible body is measured by an X-ray diffraction method, a ratio (Tc occupancy ratio) of first and second highest ranks in the texture coefficients Tc to a sum of the texture coefficients Tc of the respective plane orientations is 50% or more.

According to the present invention, since the crystal grains constituting the crystal layer formed on the surface of the crucible body have an appropriate crystal grain size and crystal orientation, crystal growth can be maintained during crystal pulling, loss of the crystal layer due to delamination or a reaction with the silicon melt can be prevented. Therefore, it is possible to form a crystal layer that is less likely to crack and has high strength even when the thickness is small, and it is possible to suppress deterioration of single crystal yield due to deformation of the crucible.

In the present invention, it is preferable that the plane orientations accounting for the first and second highest ranks in the texture coefficients Tc are a (200) plane and a (112) plane. In this case, it is particularly preferable that the texture coefficient Tc(200) of the (200) plane is larger than the texture coefficient Tc(112) of the (112) plane. Accordingly, the crystal layer can be provided with an appropriate orientation, and crystal growth can be maintained during crystal pulling, so that loss of the crystal layer due to delamination or a reaction with the silicon melt can be prevented.

In the present invention, it is preferable that an average particle size of a crystallization accelerator contained in the crystallization-accelerator-containing coating film is 0.1 to 100 μm, and a peak of a frequency distribution of particle sizes of the crystallization accelerator is in a range of 0.1 to 100 μm. In this case, the crystallization accelerator is particularly preferably barium carbonate. Accordingly, not only can the crystallization of the surface of the crucible body be simply accelerated, but also a crystal layer having an appropriate crystal grain size and crystal orientation can be formed, and crystal growth can be maintained.

In addition, a method of manufacturing a quartz glass crucible according to the present invention includes: a step of preparing a crystallization-accelerator-containing coating solution in which a crystallization accelerator is dispersed in a solvent; a step of applying the crystallization-accelerator-containing coating solution to at least one of an inner surface and an outer surface of a cylindrical crucible body which has a bottom and is made of quartz glass, in which an average particle size of the crystallization accelerator is 0.1 to 100 μm, and a peak of a frequency distribution of particle sizes of the crystallization accelerator is in a range of 0.1 to 100 μm. By applying the crystallization-accelerator-containing coating solution in a state where the crystallization accelerator is not dissolved in the solvent but dispersed in the solvent, a crystal layer having an appropriate crystal grain size and crystal orientation can be formed, and the strength of the crystal layer can be improved.

In the present invention, it is preferable that the step of preparing the crystallization-accelerator-containing coating solution includes a step of crushing the crystallization accelerator by ultrasonic irradiation before dispersing the crystallization accelerator in the solvent. In this case, the crystallization accelerator is particularly preferably barium carbonate. Accordingly, the crystallization accelerator can be uniformly dispersed in the solvent, and by optimizing the grain size distribution and crystal orientation of the crystal grains constituting the crystal layer, the strength of the crystal layer can be improved.

Effects of the Invention

According to the present invention, it is possible to provide a quartz glass crucible having high durability even under a high temperature condition during a crystal pulling step and capable of reducing a generation ratio of pinholes in a silicon single crystal. Furthermore, according to the present invention, it is possible to provide a quartz glass crucible capable of withstanding a single crystal pulling step taken for a long period of time, such as a multi-pulling, and a method of manufacturing the same.

BRIEF DESCRIPTION OF DRAWINGS

FIG. 1 is a schematic side cross-sectional view illustrating the structure of a quartz glass crucible according to a first embodiment of the present invention;

FIG. 2 shows schematic side cross-sectional views illustrating a use state of the quartz glass crucible FIG. 1, where (a) illustrates a state where a raw material is charged, and (b) illustrates a state where the raw material is melted;

FIG. 3 is a schematic view illustrating the principle of a strain measuring device;

FIG. 4 is a grayscale image of a cross section of a crucible body 10 seen through a strain measuring device 20;

FIG. 5 is a cross-sectional view of the quartz glass crucible according to the first embodiment used for pulling up a silicon single crystal, and is a view illustrating a state where the surface is crystallized by heating during a crystal pulling step;

FIGS. 6(a) and (b) are model diagrams of crystal grains constituting a crystal layer, where (a) illustrates a case where the crystal grain size is large, and (b) illustrates a case where the crystal grain size is small;

FIG. 7 is a schematic view illustrating the principle of an EBSD method;

FIGS. 8(a) to (c) are views showing an example of an EBSD analysis result of a crucible cross section, where (a) is an image quality (IQ) map, (b) is a signal map, and (c) is an IQ map (ND);

FIG. 9 is a graph showing the frequency distribution of crystal grain sizes obtained from a measurement result by the EBSD method;

FIG. 10 is a flowchart showing a method of manufacturing the quartz glass crucible;

FIG. 11 is a schematic view for describing a method of manufacturing a crucible body according to a rotational molding method;

FIG. 12 is a flowchart showing a method of preparing a crystallization-accelerator-containing coating solution;

FIG. 13 is a schematic side cross-sectional view illustrating the structure of a quartz glass crucible according to a second embodiment of the present invention;

FIG. 14 is a cross-sectional view of the quartz glass crucible according to the second embodiment used for pulling up a silicon single crystal, and is a view illustrating a state where the surface is crystallized by heating during a crystal pulling step;

FIG. 15 is a schematic side cross-sectional view illustrating the structure of a quartz glass crucible according to a third embodiment of the present invention; and FIG. 16 is a cross-sectional view of the quartz glass crucible according to the third embodiment used for pulling up a silicon single crystal, and is a view illustrating a state where the surface is crystallized by heating during a crystal pulling step.

MODE FOR CARRYING OUT THE INVENTION

Hereinafter, preferred embodiments of the present invention will be described in detail with reference to the accompanying drawings.

FIG. 1 is a schematic side cross-sectional view illustrating the structure of a quartz glass crucible according to a first embodiment of the present invention. Further, FIG. 2 shows schematic side cross-sectional views illustrating the use state of the quartz glass crucible FIG. 1, where (a) illustrates a state where a raw material is charged, and (b) illustrates a state where the raw material is melted.

As illustrated in FIG. 1 and FIG. 2, a quartz glass crucible 1 according to the present embodiment is a cylindrical container having a bottom for supporting a silicon melt 5, and includes a quartz glass crucible body (hereinafter, referred to as a "crucible body") 10, and an inner-surface coating film 13A which contains a crystallization accelerator and is formed on an inner surface 10i of the crucible body 10. The crucible body 10 has a cylindrical side wall portion 10a, a bottom portion 10b which is gently curved, and a corner portion 10c which has a larger curvature than that of the bottom portion 10b and connects the side wall portion 10a and the bottom portion 10b to each other.

The aperture of the quartz glass crucible 1 is 22 inches (about 560 mm) or more, preferably 24 inches (about 600 mm) or more, and more preferably 32 inches (about 800 mm) or more. This is because such a crucible having a large aperture is used for pulling a large-size silicon single crystal ingot having a diameter of 300 mm or more, and is required to be less likely to be deformed even when used for a long period of time and not to affect the quality of the silicon single crystal. In recent years, with an increase in the size of silicon single crystals and an increase in the time for a crystal pulling step, the thermal environment of the crucible becomes more severe, and improvement in durability of the crucible is an important issue.

Although the thickness of the crucible body 10 slightly varies depending on its part, the thickness of the side wall portion 10a of a crucible of 22 inches or more is preferably 7 mm or more, and the thickness of the side wall portion 10a of a crucible of 24 inches or more is preferably 8 mm or more. In addition, the thickness of the side wall portion 10a of a large crucible of 32 inches or more is preferably 10 mm or more, and the thickness of the side wall portion 10a of a large crucible of 40 inches (about 1000 mm) or more is more preferably 13 mm or more.

The crucible body 10 has a two-layer structure, and includes a transparent layer 11 (bubble-free layer) made of quartz glass containing no bubbles, and an opaque layer 12 (bubble layer) which is made of quartz glass containing a large number of minute bubbles and is provided on the outer side of the crucible from the transparent layer 11.

The transparent layer 11 is a layer that forms the inner surface 10i of the crucible body 10 that is in contact with the silicon melt 5, and is provided to prevent a single crystal yield from being reduced due to bubbles in quartz glass. The thickness of the transparent layer 11 is preferably 0.5 to 10 mm, and is set to an appropriate thickness for each part of the crucible so as not to cause the opaque layer 12 to be exposed due to the transparent layer 11 completely eroding during a single crystal pulling step. The transparent layer 11 is preferably provided over the entire crucible from the side wall portion 10a to the bottom portion 10b of the crucible. However, in a rim upper end portion of the crucible that is not in contact with the silicon melt, the transparent layer 11 may be omitted.

The expression the transparent layer 11 "contains no bubbles" means that the bubble content and the bubble size are such that single crystal yield is not reduced due to the bubbles. This is because there is concern that when bubbles are present in the vicinity of the inner surface of the crucible, the bubbles in the vicinity of the inner surface of the crucible cannot be confined in the quartz glass due to erosion of the inner surface of the crucible, the bubbles in the quartz glass may burst due to thermal expansion during crystal pulling, and crucible fragments (quartz pieces) may delaminate. In a case where crucible fragments released into the melt are carried to the growth interface of the single crystal by convection of the melt and are incorporated into the single crystal, this causes dislocation of the single crystal. In addition, in a case where bubbles released into the melt due to erosion of the inner surface of the crucible float up to the solid/liquid interface and are incorporated into the single crystal, this causes pinholes. The bubble content of the transparent layer 11 is preferably 0.1 vol % or less, and the average diameter of the bubbles is preferably 100 μm or less.

The bubble content of the transparent layer 11 can be measured nondestructively using optical detecting means. The optical detecting means includes a light-receiving device which receives transmitted light or reflected light of the light irradiating the crucible. Light-emitting means of the irradiation light may be built into the light-receiving device, or external light-emitting means may also be used. In addition, as the optical detecting means, one that can be turned along the inner surface of the crucible is preferably used. As the irradiation light, X-rays, laser light, and the like as well as visible light, ultraviolet light, and infrared light can be used. As the light-receiving device, a digital camera including an optical lens and an image element can be used. A bubble content per unit volume can be obtained by integrating bubble contents per unit area in a depth direction. In order to detect bubbles present at a certain depth from the surface, the focal point of the optical lens may be scanned from the surface in the depth direction. Measurement results obtained by the optical detecting means are received by an image processing device to calculate the bubble content per unit area. The bubble content per unit area can be obtained as a ratio of the area occupied by bubbles to a reference area, the reference area obtained by dividing an image of the inner surface of the crucible taken using the digital camera into predetermined areas.

The opaque layer 12 is a layer that is provided outside the transparent layer 11 and forms an outer surface 10o of the crucible body 10. The opaque layer 12 is provided to enhance heat retention of the silicon melt 5 in the crucible, and heat the silicon melt 5 in the crucible as uniformly as possible by dispersing radiant heat from a heater 6 provided to surround the crucible in a single crystal pulling apparatus (see FIG. 2(b)). Therefore, it is preferable that the opaque layer 12 is provided over the entire crucible from the side wall portion 10a to the bottom portion 10b of the crucible. The thickness of the opaque layer 12 is a value obtained by subtracting the thickness of the transparent layer 11 from the thickness of the crucible wall, and varies depending on the part of the crucible.

It is preferable that the thickness of the opaque layer 12 at the bottom portion 10b of the crucible body 10 is larger than other parts, particularly the opaque layer 12 at the side wall portion 10a. By causing the opaque layer 12 at the bottom portion 10b of the crucible body 10 to be as thick as possible, the temperature of the inner surface of the crucible can be lowered, thereby suppressing generation of pinholes in the silicon single crystal.

The bubble content of the opaque layer 12 is 0.8% or more, and preferably 1 to 5%. A change in the bubble content at the boundary between the opaque layer 12 and the transparent layer 11 is steep, and the boundary between the two is apparent with the naked eye. The bubble content of the opaque layer 12 can be obtained, for example, by specific gravity measurement (Archimedes' method) by comparing the weight per unit volume of an opaque quartz glass piece cut out of the crucible to the weight per unit volume of quartz glass containing no bubbles.

The crucible body 10 preferably includes two layers, an inner surface layer formed from a synthetic silica powder (hereinafter, referred to as "synthetic layer") and an outer surface layer formed from a natural silica powder (hereinafter, referred to as "natural layer"). The natural silica powder is a silica powder manufactured by pulverizing into particles a natural mineral containing α-quartz as a primary component. The synthetic silica powder can be manufactured by vapor phase oxidation of silicon tetrachloride ($SiCl_4$) (dry synthesis method) or hydrolysis of silicon alkoxide (sol-gel method).

As will be described in detail later, the crucible body 10 having the two-layer structure of the synthetic layer and the natural layer can be manufactured by depositing the natural silica powder along the inner surface of a mold for manufacturing a crucible, depositing the synthetic silica powder thereon, and dissolving the silica powders by Joule heat through arc discharge. In an initial stage of the arc dissolution step, strong vacuum drawing is conducted at the outside of the deposition layers of the silica powders to remove bubbles, whereby the transparent layer 11 is formed. Thereafter, the vacuum drawing is stopped or weakened, whereby the opaque layer 12 is formed outside the transparent layer 11. For this reason, although the interface between the synthetic layer and the natural layer does not always coincide with the interface between the transparent layer and the opaque layer, like the transparent layer 11, the synthetic layer preferably has a thickness that does not completely disappear by erosion of the inner surface of the crucible during the crystal pulling step.

In the present embodiment, a compressive stress layer Lc is formed in the vicinity of the inner surface 10i of the crucible body 10. In a case where internal residual stress in the vicinity of the inner surface 10i of the crucible body 10 is compressive stress, a dense crystal layer can be formed on the inner surface 10i of the crucible body 10, and strength of the inner surface 10i can be improved. As illustrated in FIG. 2(a), at the start of manufacturing of a silicon single crystal, the inside of the crucible is filled with a large amount of a polycrystalline silicon raw material 4, and the sharp tips of the polycrystalline silicon masses are pressed against the inner surface 10i of the crucible, so that an impact is likely to be applied to the inner surface 10i. However, in a case where compressive stress is applied to the inner surface 10i of the crucible, durability against impact at the time of filling with the raw material can be improved.

The thickness of the compressive stress layer Lc is preferably 0.5 mm or more. In this case, the thickness of the compressive stress layer Lc may differ for each part of the crucible, and for example, the compressive stress layer Lc in the bottom portion 10b of the crucible may be thicker. In this case, impact resistance of the inner surface of the bottom portion 10b of the crucible can be improved, generation of irregularities can be suppressed, and the probability of bubbles being trapped at the bottom portion 10b of the crucible can be reduced.

Stress strength of the compressive stress layer Lc may differ for each part of the crucible. For example, compressive stress of the bottom portion 10b and the corner portion 10c may be greater than that of the side wall portion 10a. Since the corner portion 10c supports the weight of the side wall portion, deformation of the corner portion 10c can be suppressed by increasing compressive stress of the corner portion 10c. Furthermore, by increasing compressive stress of the bottom portion 10b, it is possible to form a crystal layer which has a reduced number of irregularities which cause pinholes and is dense.

A tensile stress layer Lt may be formed on the inner side (outer surface side) of the compressive stress layer Lc. In this case, the rate of change in stress from compressive stress to tensile stress is preferably gentle. Accordingly, deformation of the crucible such as sagging or collapse to the inside can be suppressed. The tensile stress layer Lt is preferably formed in the transparent layer 11 together with the compressive stress layer Lc. This is because when the tensile stress layer Lt is formed in the opaque layer 12, fine cracks are likely to be generated between the bubbles, and there is concern that the cracks may spread and cause large cracks.

When the crystal layer formed on the inner surface 10i of the crucible body 10 becomes thicker rapidly, strength of the crucible body 10 increases, and this has an effect in a good way in terms of crucible strength. Therefore, compressive stress of the inner surface of the crucible is preferably as strong as possible, and the compressive stress layer Lc is preferably as thick as possible. Furthermore, tensile stress of the tensile stress layer Lt is preferably strong, but the thickness of the tensile stress layer Lt is preferably as thin as possible. In a case where the growth rate of the crystal layer formed on the inner surface 10i of the crucible body 10 is slow or the crystal layer is thin, the crystal layer ceases to exist. Therefore, the inner surface 10i of the crucible body 10 having stronger compressive stress can withstand an environment in which the dissolution rate of the inner surface of the crucible is fast. In addition, when the compressive stress layer Lc of the inner surface 10i of the crucible body 10 is thick, the crystal layer can be formed thick, so that the inner surface 10i can withstand a crystal pulling step taken for a long period of time.

Whether internal residual stress in the vicinity of the inner surface 10i of the crucible body 10 is compressive stress or tensile stress can be determined by observing the cross section of the crucible wall with a strain measuring device.

FIG. 3 is a schematic view illustrating the principle of the strain measuring device.

As illustrated in FIG. 3, a strain measuring device 20 includes two polarizing plates 21 and 22 combined in a crossed Nicols state. The crucible is cut in the thickness direction, and a cut crucible piece 23 is installed as a sample between the two polarizing plates 21 and 22, and observed through white light. In a case where there is no strain in the crucible piece 23, the crucible piece 23 does not give an optical path difference to white polarized light, so that the white polarized light cannot pass through the orthogonal polarizing plate 22 (analyzer). On the other hand, in a case where there is strain in the crucible piece 23, the crucible piece 23 gives an optical path difference to the white polarized light, so that the plane of polarization of the white polarized light is rotated, and a component passing through the orthogonal polarizing plate 22 (analyzer) is observed.

As described above, when white polarized light is passed through the crucible piece 23 having strain, an optical path difference corresponding to the strain occurs for each wavelength, and the amount of light passing through the polarizing plate 22 differs for each wavelength. As a result, a color is observed in the crucible piece 23 observed through the polarizing plate 22 (analyzer). The strain of the crucible piece 23 can be evaluated from this color. For example, the strain of the crucible piece 23 can be evaluated by using an interference color chart or a polarization color chart showing the relationship between chromaticity and birefringence. In addition, when a sensitive tint color method is used, it is possible to determine whether the stress is compressive stress or tensile stress based on the color, so that the interface between residual compressive stress and residual tensile stress can be observed.

FIG. 4 is a grayscale image of a cross section of the crucible body 10 seen through the strain measuring device 20.

As shown in FIG. 4, when the cross section of the crucible body 10 having internal residual stress is observed using the strain measuring device 20, a color indicating compressive stress (for example, blue) and a color indicating tensile stress (for example, orange) are respectively shown. The quartz glass crucible according to the present embodiment has a compressive stress layer present in the vicinity of the inner surface of the crucible and a tensile stress layer present on the inner side of the compressive stress layer as shown in the figure.

In addition, it is also possible to measure the stress of the strain by installing a quarter-wave plate 24 between the crucible piece 23 and the polarizing plate 22 (Sénarmont method). A specific measuring method is as follows. First, a polarizing plate 22 (analyzer) is installed so as to be in a crossed Nicols state with respect to the polarizing plate 21 (polarizer) installed in front of a light source 25. At this time, the rotation angle of the analyzer is set to 0°. Next, the sample is observed from the analyzer side, and the sample is rotated relative to the analyzer so that the sample portion whose stress is to be measured becomes brightest. Furthermore, the analyzer is rotated in a horizontal direction so that the sample portion whose stress is to be measured is darkest. When the rotation angle from the brightest state to the darkest state is referred to as °, the stress F of the strain can be obtained by the following formula.

$$F=(\lambda \times \theta/180)/(C \times L)$$

Here, λ is the wavelength (nm) of the light source, C is the photoelastic constant (nm/cm)/MPa, and L is the optical path length (cm). The photoelastic constant C of silica glass is 3.5±0.2 (nm/cm)/MPa. As the wavelength λ of the light source 25, a wavelength suitable for the quarter-wave plate 24 to be used is selected. Alternatively, a quarter-wave plate suitable for the wavelength λ of the light source 25 to be used may be selected. The optical path length L is the thickness of the sample in an optical axis direction.

On the inner surface 10i of the crucible body 10, an inner-surface coating film 13A which is a crystallization-accelerator-containing coating film is formed. The inner-surface coating film 13A plays a role of accelerating crystallization of the surface layer portion of the crucible body 10 through heating in a step of pulling a silicon single crystal. Since the transparent layer 11 is formed on the inner surface 10i side of the crucible body 10, the inner-surface coating film 13A is formed on the transparent layer 11. The inner-surface coating film 13A contains a water-soluble polymer acting as a thickener, whereby a hard film is formed on the inner surface 10i of the crucible body 10.

The thickness of the inner-surface coating film 13A is preferably 0.3 to 100 μm. The concentration of the crystallization accelerator applied to the inner surface 10i of the crucible body 10 is controlled by changing the thickness of the inner-surface coating film 13A. It should be noted that elements that can act as a crystallization accelerator are not intentionally added to the crucible body 10 made of quartz glass, and for example, in a case where the crucible body 10 is formed of a natural silica powder, it is preferable that the concentration of barium contained in the crucible body 10 is less than 0.10 ppm, the concentration of magnesium is less than 0.10 ppm, and the concentration of calcium is less than 2.0 ppm. Furthermore, in a case of using a synthetic silica powder as the constituent raw material of the inner surface of the crucible body 10, it is preferable that the concentrations of both magnesium and calcium contained in the crucible body 10 are less than 0.02 ppm.

The crystallization accelerator contained in the inner-surface coating film 13A is an element in group 2a, such as magnesium, calcium, strontium, barium, and the like. In particular, barium is particularly preferred because of its small segregation coefficient to silicon, and characteristics that the crystallization rate does not attenuate with crystallization, and growth in an orientation is caused most strongly compared to other elements. In addition, barium is stable at room temperature and easy to handle, and has substantially the same nuclear radius as that of glass (Si), so that there is also an advantage that crystal growth is easy to continue. The crystallization-accelerator-containing coating film can be formed by applying a coating solution containing the crystallization accelerator to the wall surface of the crucible. Examples of the crystallization accelerator include lithium (Li), zinc (Zn), lead (Pb), and the like in addition to the elements in group 2a. Thus, the inner-surface coating film 13A can be formed by applying the coating solution containing barium or the like to the wall surface of the crucible.

The inner-surface coating film 13A is preferably formed in a region excluding a rim upper-end surface 10t and the vicinity of the rim upper end in the inner surface 10i. That is, the vicinity of the rim upper end is preferably an uncoated region 15A to which the crystallization accelerator has not been applied. In a case where the inner-surface coating film 13A is formed over the entire inner surface including the vicinity of the rim upper end, a rim upper-end portion (upper-end surface) is also crystallized, and there is concern that particles generated from the crystallized region of the crucible body 10 may be incorporated into the silicon melt in the crucible, and yield of the silicon single crystals may decrease. However, by providing the uncoated region 15A extending downward from the rim upper end within a certain range to suppress crystallization of the rim upper-end portion, yield of silicon single crystals can be improved.

It is preferable that the uncoated region 15A extends downward from the rim upper end within a range of 2 mm or more and 40 mm or less. This is because, in a case where the width of the uncoated region 15A is smaller than 2 mm, the effect of providing the uncoated region 15A is hardly obtained. Furthermore, in a case where the width of the uncoated region 15A is greater than 40 mm, there is a higher possibility that the position of the upper end of the inner-surface coating film 13A may be lower than the initial melt surface position of the silicon melt 5 (see FIG. 2(b)). When the boundary between the crystal layer and the glass layer is immersed in the silicon melt 5, there is a higher possibility that cracks may be generated by stress concentration on the boundary region and particles of small crystal pieces may be generated. However, yield of the silicon single crystals can be improved by providing the uncoated region 15A above the initial melt surface position of the silicon melt to suppress crystallization of the rim upper-end portion.

Normally, the quartz glass crucible 1 during the crystal pulling step is accommodated in a carbon susceptor 8, and the rim upper-end portion of the quartz glass crucible 1 protrudes upward beyond the upper end of the carbon susceptor 8. Below a melt surface 5a of the silicon melt 5, the crucible wall is pressed outward by the liquid pressure and adapts to the carbon susceptor. However, above the melt surface 5a, no liquid pressure is applied, so that the crucible wall is not pressed against the carbon susceptor. Therefore, the rim upper-end portion is always in a self-sustaining state without being supported by the carbon susceptor 8 (see FIG. 2). It is preferable that the uncoated region 15A is provided in a region protruding upward beyond the upper end of the carbon susceptor 8. Stress is likely to be applied to the rim upper-end portion in a self-sustaining state without being in contact with the carbon susceptor 8, and in a case where the rim upper-end portion is crystallized, particles are likely to be generated due to cracks or the like. By causing the rim upper-end portion to become the uncoated region, dust generation due to the crystallization of the rim upper-end portion can be suppressed, and yield of silicon single crystals can be improved.

It is preferable that the range of the width of the uncoated region 15A is 0.02 times to 0.1 times the length of the side wall portion 10a of the crucible. This is because, in a case where the width of the uncoated region 15A is smaller than 0.02 times the length of the side wall portion 10a of the crucible, the effect of providing the uncoated region 15A is insufficient. Furthermore, in a case where the width of the uncoated region 15A is larger than 0.1 times the length of the side wall portion 10a of the crucible, the uncoated region is formed to reach the region supported by the carbon susceptor 8 and there is concern of deterioration of the yield of silicon single crystals.

As described above, the quartz glass crucible 1 according to the present embodiment includes the inner-surface coating film 13A formed on the inner surface 10i of the crucible body 10 made of quartz glass. When this quartz glass crucible 1 is used in an actual crystal pulling step, quartz glass is crystallized by the action of the crystallization accelerator, and a dense crystal layer is formed on the surface of the crucible body 10, thereby improving the strength of the crucible.

FIG. 5 is a cross-sectional view of the quartz glass crucible 1 used for pulling a silicon single crystal, and is a view illustrating a state where the surface is crystallized by heating during the crystal pulling step.

As illustrated in FIG. 5, on the surface of the quartz glass crucible 1 to which the crystallization accelerator is applied, crystallization of the quartz glass is accelerated by heating during the crystal pulling step, so that an inner crystal layer 14A is formed on the inner surface 10i of the crucible body 10. Heating during the step of pulling a silicon single crystal is performed even for several tens of hours or longer at a temperature of the melting point of silicon (about 1400° C.) or higher. However, how the crystal layer is formed on the surface layer portion of the crucible body 10 can be evaluated, as well as by actually performing the step of pulling a silicon single crystal, by performing a heat treatment at a temperature equal to or higher than 1400° C. and equal to or lower than the softening point of silica glass for 1.5 hours or longer.

The thickness of the inner crystal layer 14A is 200 μm or more, and preferably 400 μm or more. The inner crystal layer 14A that comes into contact with the silicon melt during the single crystal pulling is gradually eroded, but by gradually growing the inner crystal layer 14A, the thickness of the inner crystal layer 14A can be 200 μm or more, and even can be maintained at 400 μm or more.

In order for the quartz glass crucible 1 to stably hold the silicon melt at a high temperature during the crystal pull-up step for a long period of time, it is not good that just any crystal layer is formed on the crucible body 10, but that a desirable crystal grain size and a crystal orientation are present. This is because in a case where the crystal layer does not satisfy desired crystal quality, the crystal growth cannot be maintained during the crystal pulling step, the strength of the crucible body 10 is insufficient, deformation such as sagging occurs, and single crystal yield decreases.

FIGS. 6(a) and (b) are model diagrams of crystal grains constituting a crystal layer. As shown in the drawing, the crystal orientation of the crystal grains in the crystal layer is preferably perpendicular to the main surface (crucible surface) of the crystal layer, and preferably has a columnar orientation. In FIG. 6, the principal plane of a crystal layer is an XY plane, and the crystal grains have a columnar orientation elongated in a Z-axis direction. Accordingly, not only can the surface of the crucible body 10 be uniformly crystallized, but also the crystal growth can be maintained, and deformation of the crucible body 10 can be suppressed, thereby improving single crystal yield. Even if the crystal grains have the same orientation, there are cases where the crystal grain size is large (see FIG. 6(a)) or small (see FIG. 6(b)). When the crystal grain size is too large, the crystal layer is not densified, and deformation of the crucible and delamination of the crystal layer tend to occur due to insufficient strength. On the other hand, when the crystal grain size is too small, the crystal layer does not grow continuously, the thickness of the crystal layer is insufficient, and the strength of the crucible decreases.

For this reason, the average grain size of the crystal grains constituting the inner crystal layer 14A is preferably 0.1 to 100 μm, and the peak of the frequency distribution of the crystal grain sizes is preferably in a range of 0.1 to 100 μm. This is because in a case where the average grain size of the crystal grains is larger than 100 μm, the denseness of the crystal layer is insufficient and the strength of the crucible decreases, while in a case where the average grain size of the crystal grains is smaller than 0.1 μm, the crystal grains are too small and the strength of the crystal layer is weakened. Furthermore, in a case where the peak of the frequency distribution of the crystal grain size is in a range of 0.1 to 100 μm, the crystal grain size is concentrated near the average grain size, so that reliability of the measured value of the average grain size can be increased.

In addition, the sum of the first and second highest ranks in the area ratios of the plane orientations of the crystal grains constituting the crystal layer is preferably 50% or more, and particularly preferably 80% or more. Furthermore, it is preferable that the plane orientations accounting for the first and second highest ranks in the area ratios are a (200) plane and a (112) plane. As described above, in a case where the orientation of the crystal layer is strong, crystal growth can be maintained to form a crystal layer having a sufficient thickness, or a crystal layer having high strength can be formed even when the thickness is small. Accordingly, the strength of the crucible can be improved.

In a case where the plane orientations accounting for the first and second highest ranks in the area ratios are the (200) plane and the (112) plane, the area ratio of the (200) plane is preferably larger than the area ratio of the (112) plane. In a case where the area ratio of the (200) plane is larger than the area ratio of the (112) plane, the orientation of the crystal grains can be strong, and the growth of the crystal layer can be maintained for a long period of time, thereby increasing the strength of the crucible.

It is considered that the orientation of the crystal grains constituting the crystal layer is affected by the surface density of the crystallization accelerator. When the distance between crystal nuclei formed increases, various orientation growths that occur during the growth of the crystal layer are less likely to disappear, and variation in the orientation of the crystal grains increases. Furthermore, the orientation of the crystal grains is considered to be affected by the internal diffusion of the crystallization accelerator. When the crystallization accelerator diffuses from the surface toward the inside of the crucible wall, variation in the position where the crystal nuclei are generated occurs in the depth direction from the surface, and variation in the orientation of the crystal grains increases. The internal diffusion of the crystallization accelerator is caused by preheating of the crucible in a step of applying the crystallization accelerator, or by lowering a temperature rise in a temperature-raising step during pulling.

The crystal grain size and crystal orientation of the crystal layer can be evaluated by an electron backscatter diffraction pattern (EBSD) method. The EBSD method is a crystal analysis method in a submicron region using an electron channeling pattern (ECP) method, which is one of crystal analysis methods using a scanning electron microscope (SEM). The ECP method requires a special electron optical system for irradiating one point on a sample with an electron beam to irradiate the sample while sequentially changing the angle, whereas in the EBSD method, it is only necessary to stop an electron beam on an analyzed crystal grain, and there is no need to add a special device to an electron optical system.

FIG. 7 is a schematic view illustrating the principle of the EBSD method. As shown in the figure, an EBSD device 40 has a simple configuration in which an EBSD detector 41 (CCD camera) is added to the SEM. When a sample 42 inclined at about 60 to 70° is irradiated with an electron beam 43, the electron beam is scattered on each crystal plane in a shallow region up to about 50 nm from the surface of the sample 42. However, in the case of a crystalline sample, the electron beam is diffracted, and a pattern corresponding to the crystal orientation (EBSD pattern) appears. By photographing and analyzing the EBSD pattern with the EBSD detector 41, information regarding the crystal orientation of the sample can be obtained, and the orientation distribution, texture, and crystal phase distribution of crystal grains can be analyzed.

It should be noted that, in the EBSD measurement, it is necessary to set an allowable angle (tolerance) of a misorientation angle between adjacent measurement points, but in the present embodiment, the tolerance is preferably set to 1 to 5°.

FIGS. 8(a) to (c) are views showing an example of an EBSD analysis result of a crucible cross section, where (a) is an image quality (IQ) map, (b) is a signal map, and (c) is an IQ map (ND).

As shown in FIGS. 8(a) to (c), according to the EBSD method, the crystal orientation of each crystal grain can be specified, and the crystal orientations can be displayed, for example, by color. In particular, as shown in FIG. 8(a), streaky crystal grain boundaries can be observed from the cross section of the crystal layer (XZ plane or YZ plane in FIG. 6), and it can be seen that the crystal grains have a columnar orientation extending in the depth direction. Furthermore, the frequency distribution of the crystal grain sizes can be obtained by aggregating the area of each crystal grain in the IQ map for each crystal orientation. As described above, according to the EBSD method, the average grain size, the grain size distribution, and the crystal orientation of the crystal grains constituting the crystal layer can be accurately obtained.

FIG. 9 is a graph showing the frequency distribution of the crystal grain sizes obtained from the measurement result by the EBSD method. According to the EBSD method, the frequency distribution of the crystal grain sizes can be obtained from a crystal orientation map obtained when an evaluation is performed in a direction (Z-axis direction in FIG. 6) perpendicular to the surface of the crystal layer (XY plane in FIG. 6), and furthermore, the area ratio of each plane orientation of the crystal grains constituting the crystal layer can be obtained. In the present embodiment, the average grain size of the crystal grains is preferably 0.1 to 100 μm, and the peak of the frequency distribution of the crystal grain sizes is preferably in a range of 0.1 to 100 μm. In FIG. 9, the average grain size of the crystal grains is 5.5 μm, and the peak of the frequencies of the crystal grain sizes is 3 μm.

The crystal orientation of the crystal layer can also be evaluated based on a texture coefficient obtained from the measurement result of an X-ray diffraction method. The texture coefficient is a coefficient indicating the magnitude of the orientation of a crystalline sample, and the larger the value, the stronger the orientation of a specific orientation. A texture coefficient Tc (hkl) of an (hkl) plane of a sample is represented by the following formula.

$$Tc(hkl) = \frac{I(hkl)/Io(hkl)}{\frac{1}{N}\{\Sigma_N I(hkl)/Io(hkl)\}}$$ [Formula 1]

Here, I(hkl) indicates the measured intensity of X-rays from the (hkl) plane of the sample, Io(hkl) indicates the standard intensity from the (hkl) plane of a powder sample, and N indicates the number of diffraction lines. In the case of a sample having no orientation, Tc(hkl) is 1.

Then, when the texture coefficient Tc of each plane orientation of the crystal layer viewed from the surface of the crucible body 10 is measured by the X-ray diffraction method, the ratio (Tc occupancy ratio) of the first and second highest ranks in the texture coefficients Tc to the sum of the texture coefficients Tc of the plane orientations is preferably 50% or more, and particularly preferably 80% or more. In this case, it is preferable that the plane orientations accounting for the first and second highest ranks in the texture coefficients Tc are the (200) plane and the (112) plane, and it is particularly preferable that the texture coefficient Tc(200) of the (200) plane is larger than the texture coefficient Tc(112) of the (112) plane. As described above, in a case where the orientation of the crystal layer is strong, crystal growth can be maintained to form a crystal layer having a sufficient thickness, or a crystal layer having high strength can be formed even when the thickness is small. Accordingly, the strength of the crucible can be improved.

As described above, in a case where the average grain size and the plane orientation of the crystal grains constituting the crystal layer satisfy the above conditions, a crystal layer having high strength can be formed even if the thickness is small. Therefore, deformation such as sagging of the crucible can be suppressed, and single crystal yield can be improved.

In a case where the inner-surface coating film 13A is formed on the inner surface 10i of the crucible body 10, formation of scratches and indentations on the inner surface 10i of the crucible body 10 can be suppressed. In a case where the inner-surface coating film 13A is not formed, when the inside of the crucible is filled with the polycrystalline silicon raw material 4, the sharp tips of the polycrystalline silicon masses come into direct contact with the inner surface 10i of the crucible body 10, and a very large load from a large amount of the polycrystalline silicon raw material is concentrated on the sharp tips of the polycrystalline silicon masses, so that scratches and indentations are likely to be formed on the inner surface 10i. However, in a case where the inner surface 10i of the crucible body 10 is covered with the inner-surface coating film 13A, it is possible to protect the inner surface of the crucible by avoiding a situation where the inner surface 10i is directly damaged.

In the initial stage of a step of melting the polycrystalline silicon raw material 4, recessed portions such as scratches or indentations are formed on the inner surface 10i of the crucible body 10, and the recessed portions capture gas. In a quartz glass crucible in the related art in which a coating film containing a crystallization accelerator is formed on the inner surface 10i of the crucible body 10 and the inner surface 10i has no compressive stress, crystallization of the inner surface 10i proceeds in the latter half of the step of melting the raw material, and the viscosity of the inner surface of the crucible increases, so that the shape of the recessed portions is maintained. Accordingly, the gas adhering to the surface of the crucible is less likely to be separated from the surface of the crucible. The gas that has continued to adhere to the surface of the crucible is separated from the surface during the crystal pull-up step and is released into the melt, so that a pinhole is more easily generated in a single crystal than in a normal quartz glass crucible where crystallization of the inner surface is not accelerated.

In the quartz glass crucible in the related art in which the crystallization accelerator is not applied to the inner surface 10i, the inner surface of the crucible is hardly crystallized in the latter half of the step of melting the raw material, has a low viscosity because of its vitreous state, and has a reduced ability to capture the gas adhered to the surface of the crucible. Therefore, the gas adhered to the surface of the crucible is released away from the surface of the crucible in the latter half of the step of melting the raw material. That is, it is considered that the crucible on which the inner-surface coating film 13A is formed can withstand crystal pulling for a longer period of time than a crucible without the inner-surface coating film 13A formed thereon, but has a property of easily generating pinholes in a single crystal.

Contrary to this, in the quartz glass crucible according to the present invention in which compressive stress is applied to the inner surface, the inner surface of the crucible is dense, the number of recessed portions is small, and the depth of the recessed portions is small, so that the recessed portions cannot catch gas. Therefore, the pinhole generation ratio in the single crystal can be reduced.

FIG. 10 is a flowchart showing a method of manufacturing the quartz glass crucible 1. FIG. 11 is a schematic view for describing a method of manufacturing the crucible body 10 according to a rotational molding method.

As shown in FIG. 10 and FIG. 11, the quartz glass crucible 1 according to this embodiment can be manufactured by manufacturing the crucible body 10 having the compressive stress layer Lc formed on the inner surface 10i by a so-called rotational molding method, and then forming the inner-surface coating film 13A on the inner surface 10i of the crucible body 10. In the manufacturing of the crucible body 10 by the rotational molding method, a natural silica powder 16A and a synthetic silica powder 16B are sequentially deposited on an inner surface 30i of a rotating mold 30 to form a deposition layer 16 of the raw material silica powders (step S11). It is also possible to use only the natural silica powder as the raw material of the crucible body 10. These raw material silica powders remain in a certain position while being adhered to the inner surface 30i of the mold 30 by centrifugal force, and are maintained in the shape of the crucible.

Next, an arc electrode 31 is set in the mold 30, and the deposition layer 16 of the raw material silica powders is arc-melted from the inner surface 30i side of the mold (step S12). Specific conditions such as heating time and heating temperature need to be appropriately determined in consideration of conditions such as the raw materials and size of the crucible. In this case, the amount of bubbles in the melted quartz glass is controlled by suctioning the deposition layer 16 of the raw material silica powders from a large number of vent holes 32 provided on the inner surface 30i of the mold 30. Specifically, at the start of arc melting, the suction force from the large number of vent holes 32 provided on the inner surface 30i of the mold 30 is strengthened to form the transparent layer 11 (step S13), and after the formation of the transparent layer 11, the suction force is weakened to form the opaque layer 12 (step S14).

Since the arc heat is gradually transferred from the inner side to the outer side of the deposition layer 16 of the raw material silica powders to melt the raw material silica powders, by changing decompression conditions at the timing at which the raw material silica powders start to melt, the transparent layer 11 and the opaque layer 12 can be separately formed. When decompression melting is performed to strengthen decompression at the timing at which the silica powders melt, the arc atmosphere gas is not confined in the glass, and quartz glass containing no bubbles is formed. In addition, during normal melting (atmospheric pressure melting) in which decompression is weakened at the timing at which the silica powders melt, the arc atmosphere gas is confined in the glass and quartz glass containing a large number of bubbles is formed.

Thereafter, the arc heating is ended, and the crucible is cooled so that compressive stress remains in the inner surface 10i of the crucible (step S15). As a rapid cooling method, it is preferable that the arc electrode is kept as far away from the crucible as possible immediately after the end of the arc heating, and cold air is sent toward the inside of an arc furnace, particularly the inner surface of the crucible to cool the inner surface of the crucible. It should be noted that since the structure of $SiO_2$ does not change at a temperature of 1200° C. or lower, it is preferable to cool the crucible at a cooling rate of 150° C./min or more in a high temperature range of 1200° C. or higher, and a cooling rate of 280 to 300° C./min is particularly preferable. Accordingly, the crucible body 10 in which the transparent layer 11 and the opaque layer 12 are sequentially provided from the inside toward the outside of the crucible wall is completed.

Next, the inner-surface coating film 13A is formed on the inner surface 10i of the crucible body 10 thus manufactured (step S16). As described above, the inner-surface coating film 13A can be formed by applying a coating solution containing a crystallization accelerator and drying the coating solution. The application of the crystallization accelerator coating solution to the surface of the crucible can be performed by brushing and spraying. After the application, water and the like evaporate such that a hard film is formed by the thickener.

The crystallization-accelerator-containing coating solution applied to the crucible body 10 contains a crystallization accelerator such as a barium compound. The average particle size of the crystallization accelerator is preferably 0.1 to 100 µm, and more preferably 0.1 to 10 µm. In addition, the peak of the frequency distribution of the preferably in a range of 0.1 to 100 µm, and more preferably in a range of 0.1 to 10 µm. When the particle size of the crystallization accelerator is smaller than 0.1 µm, the crystal grains grown become small, and it becomes difficult to achieve continuous crystal growth. In addition, in a case where the particle size of the crystallization accelerator is larger than 100 µm, or small particles of the crystallization accelerator are aggregated to form an aggregate larger than 100 µm, the grown crystal grains also become large, decrease in strength, and tend to delaminate. However, by causing the average particle size of the crystallization accelerator to be 0.1 to 100 µm, the average grain size of the crystal grains of the crystal layer can be 0.1 to 100 µm.

The aspect ratio (major axis/minor axis) of the primary particles of the crystallization accelerator is preferably 1.0 or more and less than 10, and particularly preferably 1.0 or more and 3.0 or less. This is because when the aspect ratio of the particles of the crystallization accelerator is 10.0 or more (acicular), the particles are entangled with each other, and the dispersibility on the surface of the crucible deteriorates.

FIG. 12 is a flowchart showing a method of preparing the crystallization-accelerator-containing coating solution.

As shown in FIG. 12, in the preparation of the crystallization-accelerator-containing coating solution, in order to cause the average particle size and particle size distribution of the crystallization accelerator to be within the above ranges, the crystallization accelerator is crushed by ultrasonic irradiation (step S21), the viscosity of a solvent is adjusted to 100 mPa·s or more (step S22). Thereafter, the fine crystallization accelerator is dispersed in the solvent (Step S23). By such preparation, the grain size distribution and crystal orientation of the crystal grains in the crystal layer can be made as described above, and it becomes possible to increase the strength of the crystal layer. The particle size distribution of the crystallization accelerator crushed by ultrasonic irradiation can be measured by, for example, a Microtrac method.

The crushing of the crystallization accelerator by ultrasonic irradiation can be performed by, for example, providing a vibrator that oscillates and generates ultrasonic waves at the bottom of a water tank to crush the crystallization accelerator immersed in a liquid, and making the particles of the crystallization accelerator finer. Alternatively, an oscillator such as an ultrasonic homogenizer may be immersed in a liquid to make the crystallization accelerator in the liquid finer. The liquid containing the fine crystallization accelerator is stored in a container with a liquid stirring function, and is maintained in a state where the crystallization accelerator does not precipitate. In order to uniformly disperse the fine crystallization accelerator, it is preferable to add a thickener to cause the viscosity of the liquid to be 100 mPa·s or more.

In a case where crushing of the crystallization accelerator by ultrasonic irradiation is not performed, that is, in a state where the peak of the particle size distribution of the crystallization accelerator is more than 100 μm, variation in the particle size of the crystallization accelerator applied to the crucible is large, and this increases the kinds of orientation of the crystal layer. As a result, the occupancy ratio of a specific crystal orientation cannot be increased, and the strength of the crystal layer decreases. In contrast, in a case where crushing of the crystallization accelerator by ultrasonic irradiation is performed for a long period of time, that is, when the peak of the particle size distribution of the crystallization accelerator is 0.1 μm or less, it becomes difficult to achieve continuous crystal growth of the crystal layer. Alternatively, the crystallization accelerator may aggregate to particles larger than 100 μm, and this increases the kinds of orientation of the crystal layer.

The crystallization-accelerator-containing coating solution may be a coating solution containing a barium compound and water, or may be a coating solution which does not contain water but contains a barium compound and anhydrous ethanol. Examples of the barium compound include barium carbonate, barium chloride, barium acetate, barium nitrate, barium hydroxide, barium oxalate, barium sulfate, and the like. A barium compound insoluble in water is more preferable, and barium carbonate is particularly preferable. This is because in a case where a water-soluble barium compound such as barium hydroxide is used, the average value of the crystal grain sizes constituting the crystal layer becomes 0.1 μm or less, and the crystal grain size becomes too small, so that the strength of the crystal layer is reduced. Furthermore, barium, which is insoluble in water, is less likely to be taken into the human body, and is thus highly safe and advantageous in terms of handling.

It is preferable that the crystallization-accelerator-containing coating solution further contains a highly viscous water-soluble polymer (thickener) such as carboxyvinyl polymer. In a case of using a coating solution without a thickener contained therein, fixing of the crystallization accelerator to the wall surface of the crucible is unstable, so that a heat treatment for fixing the crystallization accelerator is necessary. When such a heat treatment is performed, the crystallization accelerator diffuses and penetrates into the quartz glass, and becomes the cause of acceleration of random growth of crystal, which will be described later. However, in a case of using a coating solution containing a thickener together with the crystallization accelerator, the viscosity of the coating solution increases, so that it is possible to prevent the coating solution from flowing with gravity when applied to the crucible and thus becoming uneven. Furthermore, in a case where the coating solution contains the water-soluble polymer, the crystallization accelerator does not cohere in the coating solution but diffuses, so that it is possible to uniformly apply the crystallization accelerator to the surface of the crucible. Therefore, the crystallization accelerator at a high concentration can be uniformly and densely fixed to the wall surface of the crucible, thereby accelerating the growth of highly oriented crystal grains.

Examples of the thickener include water-soluble polymers having few metal impurities such as polyvinyl alcohol, a cellulosic thickener, high-purity glucomannan, an acrylic polymer, a carboxyvinyl polymer, a polyethylene glycol fatty acid ester, and the like. In addition, an acrylic acid-alkyl methacrylate copolymer, polyacrylate, polyvinyl carboxylic acid amide, vinylcarboxylic acid amide, or the like may also be used as the thickener. The viscosity of the coating solution is preferably in a range of 100 to 10000 mPa·s, and the boiling point of the solvent is preferably 50 to 100° C. When the viscosity of the coating solution is lower than 100 mPa·s, the dispersed state of the crystallization accelerator cannot be maintained, and the crystallization accelerator may aggregate and increase in particle size. However, when the viscosity of the solvent is 100 mPa·s or more, the fine crystallization accelerator can be uniformly dispersed in the solvent.

The application of the crystallization accelerator coating solution to the inner surface 10$i$ of the crucible body 10 (step S16) can be performed by brushing and spraying. After the application, water and the like evaporate such that a hard film is formed by the thickener. It should be noted that it is not preferable to heat the crucible to reach a surface temperature of 200 to 300° C. for the purpose of fixing the crystallization accelerator. This is because when the surface of the crucible is heated to 100° C. or higher after applying water or alcohols containing the crystallization accelerator, barium on the surface of the crucible diffuses to the inside, and crystal nuclei are simultaneously generated, so that a desired crystal orientation is not obtained, and the strength of the crystal layer cannot be obtained.

It is preferable that the concentration of the crystallization accelerator in the surface layer portion of the crucible body 10 on which the crystallization-accelerator-containing coating film is formed is low. Elements that can act as a crystallization accelerator are not intentionally added to the crucible body 10 made of quartz glass, and for example, in a case where the crucible body 10 is formed of a natural quartz powder, it is preferable that the concentration of barium contained in the crucible body 10 is less than 0.10 ppm, the concentration of magnesium is less than 0.10 ppm, and the concentration of calcium is less than 2.0 ppm. Furthermore, in a case of using, in the crucible body 10, a synthetic quartz powder as the constituent raw material of the inner surface, it is preferable that the concentrations of both magnesium and calcium contained in the crucible body 10 are less than 0.02 ppm.

In a case where the concentration of the crystallization accelerator in the crucible body 10 is high, random growth occurs in the surface layer portion of the crucible body 10 and the crystallization accelerator in the crystallization-accelerator-containing coating film is trapped at the crystal interface, whereby it is difficult to form a crystallization-accelerator-enriched layer. However, in a case where the crystallization-accelerator-containing coating film is formed on the surface of the crucible body 10, the crystallization accelerator can be localized on the surface of the crucible body 10 at a uniform concentration. In particular, in a case where the concentration of the crystallization accelerator in the quartz glass is low, the crystallization accelerator having a high concentration is uniformly localized on the surface of the crucible body 10, so that random growth is not attained when the crystallization proceeds due to heat applied by subsequent crystal pulling and a crystallization-accelerator-enriched layer is more likely to be formed.

Accordingly, the quartz glass crucible 1 according to the present embodiment is completed. Thereafter, when a step of pulling a silicon single crystal is performed using the quartz glass crucible 1, a crystal layer having the above-described crystal grain size and crystal orientation is formed on the surface of the crucible. Therefore, it is possible to provide the quartz glass crucible 1 which is hardly cracked even when the thickness of the crystal layer is small and has high strength. Accordingly, deformation of the crucible such as sagging can be suppressed even when used under a high temperature for a long period of time during crystal pulling, and even in a case where a brown ring or the like is generated on the inner surface of the crucible, delamination thereof can be prevented, thereby improving yield of the silicon single crystals.

As described above, the quartz glass crucible 1 according to the present embodiment includes the crucible body 10 and the inner-surface coating film 13A containing the crystallization accelerator formed on the inner surface 10$i$ of the crucible body 10, the inner surface 10$i$ of the crucible body 10 is under compressive stress, and the inner-surface coating film 13A is formed on the inner surface 10$i$. Therefore, it is possible to obtain a crystal layer which is denser and stronger than that in the related art. Therefore, it is possible to provide a quartz glass crucible (silica glass crucible) having few irregularities which become the origin of generation of bubbles during the crystal pulling step. In addition, since the crystallization rate of the quartz glass under compressive stress is high, by adding the action of the crystallization accelerator thereto, the quartz glass can be crystallized at a temperature as low as 1200° C. or lower at which compressive stress is not released. Therefore, the inner surface 10$i$ can be crystallized before strain due to compressive stress is released, so that it is possible to obtain a crystal layer which is denser and stronger than that in the related art.

In addition, the quartz glass crucible 1 according to the present embodiment includes the cylindrical crucible body 10 having a bottom made of quartz glass, and the inner-surface coating film 13A formed on the inner surface 10$i$ of the crucible body 10 so as to form the inner crystal layer 14A in the vicinity of the inner surface of the crucible body 10 by being heated during the step of pulling a silicon single crystal, the average grain size of the crystal grains in the inner crystal layer 14A is 0.1 to 100 μm, the peak of the frequency distribution of the crystal grains is in a range of 0.1 to 100 μm, and when the area ratio of each plane orientation of the inner crystal layer 14A as viewed from the inner surface side of the crucible body 10 is measured by the EBSD method, the sum of the first and second highest ranks in the area ratios is 50% or more. Therefore, deformation of the crucible can be suppressed and single crystal yield can be improved.

In addition, in the method of manufacturing the quartz glass crucible 1 according to the present embodiment, the coating solution which is obtained by crushing a crystallization accelerator insoluble in water, such as barium carbonate or the like, by ultrasonic irradiation or the like, and then dispersing the crystallization accelerator in the solvent together with the thickener, and which has a viscosity of 100 mPa·s or more is used, so that a good crystallization-accelerator-containing coating film can be formed on the surface of the crucible body 10. In particular, since the coating solution is applied to the crucible in a state where the crystallization accelerator is uniformly dispersed in the coating solution within a predetermined particle size range, the crystallized portion has a uniform particle size and oriented state within a predetermined range. Therefore, the strength of the crystal layer formed on the surface of the crucible body 10 can be increased.

FIG. 13 is a schematic side cross-sectional view illustrating the structure of a quartz glass crucible according to a second embodiment of the present invention.

As illustrated in FIG. 13, a quartz glass crucible 2 according to the present embodiment is characterized in that the inner-surface coating film 13A and an outer-surface coating film 13B are formed on the inner surface 10$i$ and the outer surface 10$o$ of the crucible body 10, respectively. Similarly to the inner-surface coating film 13A, the outer-surface coating film 13B is a film containing a crystallization accelerator, and can be formed using the same coating solution as the inner-surface coating film 13A. In this case, the thickness of the outer-surface coating film 13B is preferably smaller than that of the inner-surface coating film 13A.

The compressive stress layer Lc is formed on the outer surface 10$o$ of the crucible body 10, and the outer-surface coating film 13B is formed on the outer surface 10$o$ under compressive stress. Therefore, a dense and strong crystal layer can be also formed on the outer surface 10$o$ side of the crucible body 10.

The outer-surface coating film 13B is also preferably formed in a region excluding the rim upper-end surface 10$t$ and the vicinity of the rim upper end on the outer surface 10$o$. That is, the vicinity of the rim upper end is preferably an uncoated region 15B to which the crystallization accelerator has not been applied. In a case where the outer-surface coating film 13B is formed on the entire outer surface including the vicinity of the rim upper end, the rim upper-end portion (upper end surface) is also crystallized, and there is concern that particles generated from the crystallized region may be incorporated into the silicon melt in the crucible, and yield of the silicon single crystals may decrease. However, by providing the uncoated region 15B extending downward from the rim upper end within a certain range to suppress crystallization of the rim upper-end portion, yield of silicon single crystals can be improved.

It is preferable that the uncoated region 15B extends downward from the rim upper end within a range of 2 mm or more and 40 mm or less. This is because, in a case where the width of the uncoated region 15B is smaller than 2 mm, the effect of providing the uncoated region 15B is hardly obtained. Furthermore, in a case where the width of the uncoated region 15B is greater than 40 mm, strengthening of the outer surface 10$o$ of the crucible body 10 by the outer-surface coating film 13B is insufficiently achieved.

As described above, although the quartz glass crucible 1 during the crystal pulling step is accommodated in the carbon susceptor 8, the rim upper-end portion of the quartz glass crucible 1 protrudes upward beyond the upper end of the carbon susceptor 8, and is always in a self-sustaining state without being supported by the carbon susceptor 8 (see FIG. 2). It is preferable that the uncoated region 15B is provided in a region protruding upward beyond the upper end of the carbon susceptor 8. By causing the rim upper-end portion of the quartz glass crucible 1 that is not in contact with the carbon susceptor 8 to become the uncoated region, dust generation due to crystallization of the rim upper-end portion can be suppressed, and yield of the silicon single crystals can be improved.

It is preferable that the range of the width of the uncoated region 15B is 0.02 times to 0.1 times the length of the side wall portion 10$a$ of the crucible. This is because, in a case where the width of the uncoated region 15B is smaller than 0.02 times the length of the side wall portion 10$a$ of the crucible, the effect of providing the uncoated region 15B is insufficient. Furthermore, in a case where the width of the uncoated region 15B is larger than 0.1 times the length of the side wall portion 10$a$ of the crucible, the uncoated region is formed to reach the region supported by the carbon susceptor 8 and there is concern of deterioration of yield of silicon single crystals.

The bubble content in the vicinity of the outer surface 10o of the crucible body 10 is 5% or less, and particularly preferably 0.8 to 5%. In a case where the bubble content in the vicinity of the outer surface 10o of the crucible body 10 is very high, when the outer surface 10o of the crucible body 10 is crystallized, there is concern that the outer crystal layer may foam and delaminate due to the bubbles and the crucible may deform. However, in a case where the bubble content in the vicinity of the outer surface 10o is 5% or less, deformation of the crucible due to foaming and delamination of the outer crystal layer can be prevented. In a case where a crystallization accelerator containing an element in group 2a is used, although the crystallization rate of the quartz glass is high, crystal growth stops at a certain thickness, and crystal growth does not continue for a long period of time. Therefore, when the bubble content in the vicinity of the outer surface 10o of the crucible body 10 is 5% or less, foaming and delamination of the outer crystal layer can be sufficiently suppressed. In a case where the bubble content in the vicinity of the outer surface is higher than 5%, even if the growth of the crystal layer stops at a certain thickness, the probability that the outer crystal layer foams and delaminates increases, which is not preferable. Furthermore, in a case where the bubble content is lower than 0.8%, a translucent layer or a transparent layer is formed on the outer surface 10o of the crucible body 10, and the heat retention and heat insulation of the crucible body 10 are reduced, which is not preferable.

As described above, the quartz glass crucible 2 according to the present embodiment has not only the inner-surface coating film 13A formed on the inner surface 10i of the crucible body 10, but also the outer-surface coating film 13B formed on the outer surface 10o. Therefore, in addition to the effects of the first embodiment, it is possible to suppress a decrease in single crystal yield due to deformation of the crucible.

FIG. 14 is a cross-sectional view of the quartz glass crucible 2 according to the second embodiment used for pulling a silicon single crystal, and is a view illustrating a state where the surface is crystallized by heating during the crystal pulling step.

As illustrated in FIG. 14, on the surface of the quartz glass crucible 2 to which the crystallization accelerator is applied, crystallization of the quartz glass is accelerated by heating during the crystal pulling step, so that the inner crystal layer 14A and an outer crystal layer 14B are respectively formed on the inner surface 10i and the outer surface 10o of the crucible body 10.

As described above, the thickness of the inner crystal layer 14A is 200 µm or more, and preferably 400 µm or more. The inner crystal layer 14A that comes into contact with the silicon melt during the single crystal pulling is gradually eroded, but by gradually growing the inner crystal layer 14A, the thickness of the inner crystal layer 14A can be 200 µm or more, and even can be maintained at 400 µm or more.

On the other hand, the thickness of the outer crystal layer 14B is 200 µm or more, but is preferably thinner than the inner crystal layer 14A, and the orientation of the crystal grains is preferably weaker than that of the inner crystal layer 14A. Accordingly, the continuity of the crystal growth is weakened, so that it is possible to prevent the outer crystal layer 14B from becoming excessively thick. Therefore, delamination of the crystal layer due to expansion of bubbles at the interface between the thick crystal layer and the quartz glass can be prevented, and generation of cracks along the crystal grain boundaries can be prevented.

The inner crystal layer 14A and the outer crystal layer 14B have the same crystal grain size and crystal orientation as the inner crystal layer 14A in the first embodiment. The average grain size of the crystal grains constituting the inner crystal layer 14A and the outer crystal layer 14B is preferably 0.1 to 100 µm, and the peak of the frequency distribution of the crystal grain sizes is preferably in a range of 0.1 to 100 µm. In addition, the sum of the first and second highest ranks in the area ratios of the plane orientations of the crystal grains constituting the crystal layer is preferably 50% or more, and particularly preferably 80% or more. Furthermore, it is preferable that the plane orientations accounting for the first and second highest ranks in the area ratios are a (200) plane and a (112) plane. When the crystal layer satisfies desired crystal quality, crystal growth can be maintained during the crystal pulling step, and both the strength of the crucible body 10 and the single crystal yield can be improved.

FIG. 15 is a schematic side cross-sectional view illustrating the structure of a quartz glass crucible according to a third embodiment of the present invention.

As illustrated in FIG. 15, a quartz glass crucible 3 according to the present embodiment is characterized in that the outer-surface coating film 13B is formed only on the outer surface 10o of the crucible body 10. The compressive stress layer Lc is formed on the inner surface 10i and the outer surface 10o of the crucible body 10, and the outer-surface coating film 13B is formed on the outer surface 10o under compressive stress.

The outer-surface coating film 13B is preferably formed in a region excluding the rim upper-end surface 10t and the vicinity of the rim upper end on the outer surface 10o. That is, the vicinity of the rim upper end is preferably an uncoated region 15B to which the crystallization accelerator has not been applied. It is preferable that the uncoated region 15B extends downward from the rim upper end within a range of 2 mm or more and 40 mm or less.

As described above, although the quartz glass crucible 1 during the crystal pulling step is accommodated in the carbon susceptor 8, the rim upper-end portion of the quartz glass crucible 1 protrudes upward beyond the upper end of the carbon susceptor 8, and is always in a self-sustaining state without being supported by the carbon susceptor 8 (see FIG. 2). It is preferable that the uncoated region 15B is provided in a region protruding upward beyond the upper end of the carbon susceptor 8. By causing the rim upper-end portion of the quartz glass crucible 1 that is not in contact with the carbon susceptor 8 to become the uncoated region, dust generation due to the crystallization of the rim upper-end portion can be suppressed, and yield of silicon single crystals can be improved.

The bubble content in the vicinity of the outer surface 10o of the crucible body 10 is 5% or less, and particularly preferably 0.8 to 5%. When the bubble content in the vicinity of the outer surface 10o of the crucible body 10 is 5% or less, foaming and delamination of the outer crystal layer can be sufficiently suppressed. Furthermore, when the bubble content is 0.8% or more, it is possible to prevent a decrease in heat retention and heat insulation due to the formation of a translucent layer or a transparent layer on the outer surface 10o of the crucible body 10.

According to the present embodiment, a dense and strong crystal layer can be formed on both the inner surface 10i and the outer surface 10o of the crucible body 10. Furthermore, by forming the compressive stress layer Lc on the inner surface 10*i* of the crucible, the number of recessed portions such as scratches and indentations formed on the inner surface 10*i* of the crucible can be reduced, and the depth of the recessed portions can be reduced.

In particular, in a temperature range from the start of crystallization to 1200° C. in which strain in the crucible is not released, the outer crystal layer rapidly grows and increases in thickness, and force for compressing the crucible toward the inside (contraction in the horizontal direction) is applied. Accordingly, compressive stress on the inner surface side of the crucible is increased, the thickness of the compressed layer of the inner surface is further increased, so that strength on the inner surface side of the crucible is improved. Furthermore, in a temperature range from 1200° C. to the melting point of silicon, compressive and tensile stresses are released. However, since the thickness of the outer crystal layer is increased, deformation of the crucible, such as collapse to the inside, is suppressed. In addition, as the compression of the inner surface of the crucible is maintained by the load of the polycrystalline silicon in the crucible in a state where the outer surface of the crucible is not deformed, the denseness of the inner surface of the crucible is maintained, so that strength of the crucible inner surface is also maintained. Therefore, generation of pinholes in the single crystal can be suppressed by reducing the number of bubbles trapped in the inner surface of the crucible.

FIG. 16 is a cross-sectional view of the quartz glass crucible 1 used for pulling a silicon single crystal, and is a view illustrating a state where the surface is crystallized by heating during the crystal pulling step.

As illustrated in FIG. 16, on the surface of the quartz glass crucible 1 to which the crystallization accelerator is applied, crystallization of the quartz glass is accelerated by heating during the crystal pulling step, so that the outer crystal layer 14B is formed on the outer surface 10*o* of the crucible body 10.

As described above, the thickness of the outer crystal layer 14B is 200 µm or more, but is preferably thinner than the inner crystal layer 14A, and the orientation of the crystal grains is preferably weaker than that of the inner crystal layer 14A. Accordingly, the continuity of the crystal growth is weakened, so that it is possible to prevent the outer crystal layer 14B from becoming excessively thick. Therefore, delamination of the crystal layer due to expansion of bubbles at the interface between the thick crystal layer and the quartz glass can be prevented, and generation of cracks along the crystal grain boundaries can be prevented.

The outer crystal layer 14B has the same crystal grain size and crystal orientation as the outer crystal layer 14B in the second embodiment. The average grain size of the crystal grains constituting the outer crystal layer 14B is preferably 0.1 to 100 µm, and the peak of the frequency distribution of the crystal grain sizes is preferably in a range of 0.1 to 100 µm. In addition, the sum of the first and second highest ranks in the area ratios of the plane orientations of the crystal grains constituting the crystal layer is preferably 50% or more, and particularly preferably 80% or more. Furthermore, it is preferable that the plane orientations accounting for the first and second highest ranks in the area ratios are a (200) plane and a (112) plane. When the crystal layer satisfies desired crystal quality, crystal growth can be maintained during the crystal pulling step, and both the strength of the crucible body 10 and the single crystal yield can be improved.

While the preferred embodiments of the present invention have been described above, the present invention is not limited to the embodiments and may be variously modified without departing from the scope of the present invention. Accordingly, all such modifications are naturally included in the scope of the present invention.

For example, in the above-described embodiment, the rim upper-end portion is the uncoated region of the crystallization accelerator, but the inner-surface coating film 13A and the outer-surface coating film 13B can also be formed up to the rim upper-end portion.

EXAMPLES

Example A1

A quartz glass crucible of Example A1 was prepared in which the inner-surface coating film 13A containing the crystallization accelerator was formed on the inner surface 10*i* of the crucible body 10 in which the inner surface 10*i* and the outer surface 10*o* were under compressive stress. However, the inner surface and the outer surface present on the rim upper-end surface 10*t* and a range of the inner surface 10*i* extending downward to 20 mm from the upper end thereof were the uncoated regions of the crystallization accelerator. Furthermore, the bubble content in the region in the vicinity of the outer surface from the outer surface 10*o* of the crucible body 10 to a depth of 2 mm was 4%.

Next, after pulling up a silicon single crystal using this quartz glass crucible, the obtained silicon single crystal was processed into a wafer product, and the pinhole generation ratio and the single crystal yield were evaluated. The pinhole generation ratio is the ratio of the number of wafers having pinholes to the total number of wafers obtained from one silicon single crystal, and the presence or absence of pinholes was visually inspected. The single crystal yield is the weight ratio of the silicon single crystal to the input weight of a polycrystalline silicon raw material. Table 1 shows the results.

TABLE 1

|  | Example A1 | Example A2 | Example A3 | Example A4 | Example A5 | Example A6 | Comparative Example A1 | Example A7 | Example A8 |
|---|---|---|---|---|---|---|---|---|---|
| Crystallization-accelerator-containing coating film | Inner surface only | Inner surface only | Inner surface only | Inner surface only | Inner surface only | Inner surface only | Inner surface only | Inner surface + outer surface | Outer surface only |
| Inner surface strain | Compressive | Compressive | Compressive | Compressive | Compressive | Compressive | Absent | Compressive | Compressive |
| Outer surface strain | Compressive | Compressive | Absent | Compressive | Absent | Compressive | Absent | Compressive | Compressive |

TABLE 1-continued

|  | Example A1 | Example A2 | Example A3 | Example A4 | Example A5 | Example A6 | Comparative Example A1 | Example A7 | Example A8 |
|---|---|---|---|---|---|---|---|---|---|
| Bubble content of outer surface (%) | 4 | 8 | 3 | 3 | 3 | 8 | 9 | 4 | 4 |
| Coating of rim upper-end surface | Absent | Absent | Absent | Present | Present | Present | Present | Absent | Absent |
| Coating of rim upper-end portion (2 to 40 mm) | Absent | Absent | Absent | Present | Present | Present | Present | Absent | Absent |
| Pinhole generation ratio (%) | 0.21 | 0.22 | 0.18 | 0.22 | 0.17 | 0.18 | 4 | 0.14 | 0.19 |
| Yield of silicon single crystal (%) | 86 | 79 | 77 | 78 | 73 | 72 | 55 | 88 | 82 |

As shown in Table 1, the pinhole generation ratio of the silicon single crystal manufactured using the quartz glass crucible was 0.21%, and the single crystal yield was 86%.

Example A2

A quartz glass crucible having substantially the same characteristics as in Example A1, except that the bubble content in a region in the vicinity of the outer surface of the crucible body 10 was as high as 8%, was prepared, and pulling of a silicon single crystal was performed using the quartz glass crucible. As a result, as shown in Table 1, the pinhole generation ratio of the silicon single crystal was 0.22%, and the single crystal yield was 79%.

Example A3

A quartz glass crucible having substantially the same characteristics as in Example A1, except that compressive stress was present in the inner surface 10i of the crucible body 10 but was not present in the outer surface 10o, and the bubble content in a region in the vicinity of the outer surface was 3%, was prepared, and pulling of a silicon single crystal was performed using the quartz glass crucible. As a result, as shown in Table 1, the pinhole generation ratio of the silicon single crystal was 0.18%, and the single crystal yield was 77%.

Example A4

A quartz glass crucible having substantially the same characteristics as in Example A1, except that the crystallization accelerator was applied to the inner surface 10i and the outer surface 10o of the rim upper-end surface and the upper-end portion of the crucible body 10, was prepared, and pulling of a silicon single crystal was performed using the quartz glass crucible. As a result, as shown in Table 1, the pinhole generation ratio of the silicon single crystal was 0.22%, and the single crystal yield was 78%.

Example A5

A quartz glass crucible having substantially the same characteristics as in Example A1, except that compressive stress was present in the inner surface 10i of the crucible body 10 but was not present in the outer surface 10o, and furthermore, the crystallization accelerator was applied to the inner surface and the outer surface of the rim upper-end surface and the upper end-portion of the crucible body 10, was prepared, and pulling of a silicon single crystal was performed using the quartz glass crucible. As a result, as shown in Table 1, the pinhole generation ratio of the silicon single crystal was 0.17%, and the single crystal yield was 73%.

Example A6

A quartz glass crucible having substantially the same characteristics as in Example A1, except that the bubble content in a region in the vicinity of the outer surface of the crucible body was as high as 8%, and furthermore, the crystallization accelerator was applied to the inner surface and the outer surface of the rim upper-end surface and the upper-end portion of the crucible body, was prepared, and pulling of a silicon single crystal was performed using the quartz glass crucible. As a result, as shown in Table 1, the pinhole generation ratio of the silicon single crystal was 0.18%, and the single crystal yield was 72%.

Comparative Example A1

A quartz glass crucible having substantially the same characteristics as in Example A1, except that no compressive stress layer was present in both the inner surface 10i and the outer surface 10o of the crucible body 10, the bubble content in a region in the vicinity of the outer surface of the crucible body 10 was as high as 9%, and furthermore, the crystallization accelerator was applied to the inner surface and the outer surface on the rim upper-end surface and in the vicinity of the rim upper end of the crucible body 10, was prepared, and pulling of a silicon single crystal was performed using the quartz glass crucible. As a result, as shown in Table 1, the pinhole generation ratio of the silicon single crystal was as high as 4%, and the single crystal yield was as extremely low as 55%.

From the above results, it could be seen that in the quartz glass crucible in which the crystallization-accelerator-containing coating film is formed on the inner surface 10$i$ of the crucible body 10 in which the inner surface 10$i$ is under compressive stress, the pinhole generation ratio and the single crystal yield can be improved.

Example A7

A quartz glass crucible having substantially the same characteristics as in Example A1, except that a coating film containing the crystallization accelerator was formed not only on the inner surface 10$i$ but also on the outer surface 10$o$ of the crucible, was prepared, and pulling of a silicon single crystal was performed using the quartz glass crucible. As a result, as shown in Table 1, the pinhole generation ratio of the silicon single crystal was 0.14%, and the single crystal yield was 88%.

Example A8

A quartz glass crucible having substantially the same characteristics as in Example A1, except that a coating film containing the crystallization accelerator was formed only on the outer surface 10$o$ of the crucible, was prepared, and pulling of a silicon single crystal was performed using the quartz glass crucible. As a result, as shown in Table 1, the pinhole generation ratio of the silicon single crystal was 0.19%, and the single crystal yield was 82%.

Example B1

Crystallization Accelerator Application Conditions

A quartz glass crucible body having an aperture of 32 inches manufactured by a rotational molding method was prepared, and a crystallization accelerator was applied to the inner surface and the outer surface of the crucible body. The crystallization accelerator coating solution was produced by including each of 0.0012 g/mL of barium carbonate and 0.0008 g/mL of a carboxyvinyl polymer, adjusting the ratio between ethanol and pure water, and mixing and stirring the resultant. Barium carbonate was crushed by ultrasonic irradiation so that the average particle size became 100 µm or less, and then mixed and stirred in a solvent to produce a crystallization-accelerator-containing coating solution. The average particle size of the crystallization accelerator particles in the coating solution was 1 µm, the peak of the particle size frequency was 2 µm, and the liquid viscosity of the solution was 400 mPa·s. This coating solution was applied to the inner surface and the outer surface of the crucible body and dried to complete a sample of a quartz glass crucible for pulling a silicon single crystal (Example B1a).

Evaluation Conditions

Next, using this crucible sample, a step of pulling a silicon single crystal was performed by the CZ method. After the pulling was ended, the degree of sagging of the crucible sample used was measured. As shown in Table 2, the degree of sagging at the upper end of the crucible was about 2 mm. In addition, the single crystal yield (weight ratio of the pulled single crystal to the input raw material) was 86%, which was a good result exceeding 70%.

Evaluation of Crystallinity by EBSD

Next, the state of the crystal layer formed on the surface of the crucible sample used was evaluated by the EBSD method. For the crystal analysis by the EBSD method, a Schottky field emission scanning electron microscope (JSM-7800FPRIME manufactured by JEOL Ltd.) was used. The allowable angle (tolerance) of the misorientation angle was set to 5°. As a result, as shown in Table 2, the average grain size of the crystal grains was 0.11 µm, and the peak of the frequency distribution of the crystal grain sizes was 0.18 µm. Furthermore, the highest three ranks in the area ratios of the plane orientation were (200) plane: 30.5%, (112) plane: 23.6%, and (113) plane: 16.2%. The sum of the area ratios of the (200) plane and the (112) plane as the plane orientations accounting for the first and second highest ranks was 54%, so that the orientation of the crystal grains was high.

TABLE 2

| | Average crystal grain size (µm) | Particle size at position of peak of frequency distribution | Sum of areas ratios of first and second ranks (%) | Orientation planes of first and second ranks in area ratios | | Order of area ratios | Degree of sagging of crucible upper end (mm) | Yield of silicon single crystals (%) |
|---|---|---|---|---|---|---|---|---|
| Example B1a | 0.11 | 0.18 | 54 | 200 | 112 | (200) > (112) | 2 | 86 |
| Example B2a | 8.1 | 8.4 | 67 | 200 | 112 | (200) > (112) | 3 | 83 |
| Example B3a | 94 | 84 | 79 | 200 | 112 | (200) > (112) | 3 | 84 |
| Example B4a | 0.53 | 0.48 | 51 | 200 | 112 | (200) > (112) | 11 | 76 |
| Example B5a | 79 | 76 | 30 | 200 | 112 | (200) > (112) | 15 | 74 |
| Example B6a | 0.53 | 0.48 | 66 | 200 | 202 | (200) > (112) | 14 | 72 |
| Example B7a | 0.89 | 0.76 | 71 | 200 | 112 | (200) < (112) | 10 | 75 |
| Comparative Example B1a | 0.07 | 0.06 | 51 | 200 | 112 | (200) > (112) | 37 | 42 |
| Comparative Example B2a | 110 | 112 | 60 | 200 | 112 | (200) > (112) | 33 | 38 |

Evaluation of Crystallinity by X-Ray Diffraction Method

Using another crucible sample (Example B1b) manufactured under the same conditions as the crucible sample (Example B1a), a step of pulling a silicon single crystal by the CZ method was performed. After the pulling was ended, the degree of sagging of the crucible sample used was measured. As shown in Table 3, the degree of sagging at the upper end of the crucible was about 1 mm. In addition, the single crystal yield was 88%, which was a good result exceeding 70%. Furthermore, the crucible sample used was evaluated by the EBSD method. As shown in Table 3, the average grain size of the crystal grains was 0.13 μm, and the peak of the frequency distribution of the crystal grain sizes was 0.19 μm.

Next, the state of the crystal layer formed on the surface of the crucible sample (Example B1b) was evaluated by the X-ray diffraction method. In the evaluation by the X-ray diffraction method, an X-ray diffractometer RINT 2500 manufactured by Rigaku Corporation was used, and target: Cu ($\lambda$=1.5418 nm), scanning axis: 2θ, measurement method: continuous, 2θ angle scanning range: 10 to 70°, light-receiving slit: 0.15 mm, divergence slit: 1°, scattering slit: 1°, sampling width: 0.02°, and scanning speed: 10°/min were set. The depth (detection depth) from the surface being evaluated by X-rays varied depending on the incident angle of X-rays, and was set to several nanometers to several tens of micrometers here. X-rays were irradiated perpendicularly to the surface of the sample on which the crystal layer was formed.

Next, the texture coefficient Tc of the crystal layer was calculated based on the measurement results. As a result, the highest three ranks in the texture coefficients Tc of the plane orientations were Tc(200): 33.5%, Tc(112): 30.3%, and Tc(113): 12.6%. In addition, as shown in Table 3, the Tc occupancy ratio of the first and second highest ranks was 64%, and it could be confirmed from the measurement results by the X-ray diffraction method that the orientation was high.

of the solution was 400 mPa·s. As a result, the degree of sagging of the crucible was about 3 mm. In addition, the single crystal yield was 83%, which was a good result exceeding 70%.

The crystal layer of the crucible sample used was evaluated by the EBSD method. The average grain size of the crystal grains was 8.1 μm, and the peak of the frequency distribution of the crystal grain sizes was 8.4 μm. In addition, the highest three ranks in the area ratios of the plane orientations were (200) plane: 34.8%, (112) plane: 32.0%, and (113) plane: 10.7%. Furthermore, the sum of the area ratios of the plane orientations accounting for the first and second highest ranks was 67%, and the orientation of the crystal grain was high.

Using another crucible sample (Example B2b) manufactured under the same conditions as the crucible sample (Example B2a), a step of pulling a silicon single crystal by the CZ method was performed, and thereafter the degree of sagging of the crucible sample used was measured. As shown in Table 3, the degree of sagging at the upper end of the crucible was about 3 mm. In addition, the single crystal yield was 84%, which was a good result exceeding 70%. Furthermore, the crucible sample used was evaluated by the EBSD method. As shown in Table 3, the average grain size of the crystal grains was 7.8 μm, and the peak of the frequency distribution of the crystal grain sizes was 7.4 μm.

Next, the crucible sample used was evaluated by the X-ray diffraction method. The highest three ranks in the texture coefficients Tc of the plane orientations of the crystal layer were Tc(200): 39.2%, Tc(112): 31.9%, and Tc(113): 9.7%. In addition, the Tc occupancy ratio of the first and second highest ranks was 71%, and it could be confirmed from the measurement results by the X-ray diffraction method that the orientation of the crystal grains was high.

Example B3

A crucible was manufactured under the application conditions of the crystallization accelerator different from those

TABLE 3

| | Average crystal grain size (μm) | Particle size at position of peak of frequency distribution (μm) | Tc occupancy ratio of first and second ranks (%) | Orientation planes of first and second ranks in texture coefficients Tc | | Order of texture coefficients Tc | Degree of sagging of crucible upper end (mm) | Yield of silicon single crystals (%) |
|---|---|---|---|---|---|---|---|---|
| Example B1b | 0.13 | 0.19 | 64 | 200 | 112 | (200) > (112) | 1 | 88 |
| Example B2b | 7.8 | 7.4 | 71 | 200 | 112 | (200) > (112) | 3 | 84 |
| Example B3b | 97 | 91 | 80 | 200 | 112 | (200) > (112) | 2 | 88 |
| Example B4b | 0.49 | 0.49 | 33 | 200 | 112 | (200) > (112) | 9 | 81 |
| Example B5b | 77 | 75 | 51 | 200 | 112 | (200) > (112) | 9 | 79 |
| Example B6b | 0.53 | 0.48 | 71 | 200 | 202 | (200) > (112) | 13 | 74 |
| Example B7b | 0.86 | 0.81 | 74 | 200 | 112 | (200) < (112) | 14 | 73 |
| Comparative Example B1b | 0.08 | 0.08 | 53 | 200 | 112 | (200) > (112) | 31 | 41 |
| Comparative Example B2b | 108 | 112 | 55 | 200 | 112 | (200) > (112) | 38 | 33 |

Example B2

A crucible was manufactured under the application conditions of the crystallization accelerator different from that of Example B1, and pulling of a silicon single crystal was performed using the crucible sample (Example B2a). The average particle size of the crystallization accelerator particles in the coating solution was 8 μm, the peak of the particle size frequency was 10 μm, and the liquid viscosity of Examples B1 and B2, and pulling of a silicon single crystal was performed using the crucible sample (Example B3a). The average particle size of the crystallization accelerator particles in the coating solution was 20 μm, the peak of the particle size frequency was 30 μm, and the liquid viscosity of the solution was 400 mPa·s. As a result, the degree of sagging of the crucible was about 3 mm. In addition, the single crystal yield was 84%, which was a good result exceeding 70%.

The crystal layer of the crucible sample used was evaluated by the EBSD method. The average grain size of the crystal grains was 94 μm, and the peak of the frequency distribution of the crystal grain sizes was 84 μm. In addition, the highest three ranks in the area ratios of the plane orientations were (200) plane: 42.1%, (112) plane: 37.1%, and (113) plane: 7.3%. Furthermore, the sum of the area ratios of the plane orientations accounting for the first and second highest ranks was 79%, and the orientation of the crystal grain was very high.

Using another crucible sample (Example B3b) manufactured under the same conditions as the crucible sample (Example B3a), a step of pulling a silicon single crystal by the CZ method was performed, and thereafter the degree of sagging of the crucible sample used was measured. As shown in Table 3, the degree of sagging at the upper end of the crucible was about 2 mm. In addition, the single crystal yield was 88%, which was a good result exceeding 70%. Furthermore, the crucible sample used was evaluated by the EBSD method. As shown in Table 3, the average grain size of the crystal grains was 97 μm, and the peak of the frequency distribution of the crystal grain sizes was 91 μm.

Next, the crucible sample used was evaluated by the X-ray diffraction method. The highest three ranks in the texture coefficients Tc of the plane orientations of the crystal layer were Tc(200): 41.1%, Tc(112): 39.0%, and Tc(113): 6.8%. In addition, the Tc occupancy ratio of the first and second highest ranks was 80%, and it could be confirmed from the measurement results by the X-ray diffraction method that the orientation of the crystal grains was very high.

Example B4

A crucible was manufactured under the application conditions of the crystallization accelerator different from those of Examples B1 to B3, and pulling of a silicon single crystal was performed using the crucible sample (Example B4a). The average particle size of the crystallization accelerator particles in the coating solution was 1 μm, the peak of the particle size frequency was 3 μm, and the liquid viscosity of the solution was 90 mPa·s. As a result, the degree of sagging of the crucible was about 11 mm. In addition, the single crystal yield was 76%, which was a good result exceeding 70%.

The crystal layer of the crucible sample used was evaluated by the EBSD method. The average grain size of the crystal grains was 0.53 μm, and the peak of the frequency distribution of the crystal grain sizes was 0.48 μm. In addition, the highest three ranks in the area ratios of the plane orientations were (200) plane: 25.9%, (112) plane: 25.5%, and (113) plane: 15.1%. Furthermore, the sum of the area ratios of the plane orientations accounting for the first and second highest ranks was 51%, and the orientation of the crystal grain was slightly low.

Using another crucible sample (Example Bob) manufactured under the same conditions as the crucible sample (Example B4a), a step of pulling a silicon single crystal by the CZ method was performed, and thereafter the degree of sagging of the crucible sample used was measured. As shown in Table 3, the degree of sagging at the upper end of the crucible was about 9 mm. In addition, the single crystal yield was 81%, which was a good result exceeding 70%. Furthermore, the crucible sample used was evaluated by the EBSD method. As shown in Table 3, the average grain size of the crystal grains was 0.49 μm, and the peak of the frequency distribution of the crystal grain sizes was 0.49 μm.

Next, the crucible sample used was evaluated by the X-ray diffraction method. The highest three ranks in the texture coefficients Tc of the plane orientations of the crystal layer were Tc(200): 16.8%, Tc(112): 16.2%, and Tc(113): 16.0%. In addition, the Tc occupancy ratio of the first and second highest ranks was 33%, and it could be confirmed from the measurement results by the X-ray diffraction method that the orientation of the crystal grains was slightly low.

Example B5

A crucible was manufactured under the application conditions of the crystallization accelerator different from those of Examples B1 to B4, and pulling of a silicon single crystal was performed using the crucible sample (Example B5a). The average particle size of the crystallization accelerator particles in the coating solution was 8 μm, the peak of the particle size frequency was 9 μm, and the liquid viscosity of the solution was 80 mPa·s. As a result, the degree of sagging of the crucible was about 15 mm. In addition, the single crystal yield was 74%, which was a good result exceeding 70%.

The crystal layer of the crucible sample used was evaluated by the EBSD method. The average grain size of the crystal grains was 79 μm, and the peak of the frequency distribution of the crystal grain sizes was 76 μm. In addition, the highest three ranks in the area ratios of the plane orientations were (200) plane: 15.7%, (112) plane: 14.6%, and (113) plane: 14.2%. Furthermore, the sum of the area ratios of the plane orientations accounting for the first and second highest ranks was 30%, and the orientation of the crystal grain was low.

Using another crucible sample (Example B5b) manufactured under the same conditions as the crucible sample (Example B5a), a step of pulling a silicon single crystal by the CZ method was performed, and thereafter the degree of sagging of the crucible sample used was measured. As shown in Table 3, the sagging amount at the upper end of the crucible was about 9 mm. In addition, the single crystal yield was 79%, which was a good result exceeding 70%. Furthermore, the crucible sample used was evaluated by the EBSD method. As shown in Table 3, the average grain size of the crystal grains was 77 μm, and the peak of the frequency distribution of the crystal grain sizes was 75 μm.

Next, the crucible sample used was evaluated by the X-ray diffraction method. The highest three ranks in the texture coefficients Tc of the plane orientations of the crystal layer were Tc(200): 27.7%, Tc(112): 23.7%, and Tc(113): 14.0%. In addition, the Tc occupancy ratio of the first and second highest ranks was 51%, and it could be confirmed from the measurement results by the X-ray diffraction method that the orientation of the crystal grains was slightly low.

Example B6

A crucible was manufactured under the application conditions of the crystallization accelerator different from those of Examples B1 to B5, and pulling of a silicon single crystal was performed using the crucible sample (Example B6a). The average particle size of the crystallization accelerator particles in the coating solution was 1 μm, the peak of the particle size frequency was 3 μm, and the liquid viscosity of the solution was 30 mPa·s. As a result, the degree of sagging of the crucible was about 14 mm. In addition, the single crystal yield was 72%.

The crystal layer of the crucible sample used was evaluated by the EBSD method. The average grain size of the crystal grains was 0.53 μm, and the peak of the frequency distribution of the crystal grain sizes was 0.48 μm. In addition, the highest three ranks in the area ratios of the plane orientations were (200) plane: 33.6%, (202) plane: 32.1%, and (112) plane: 11.2%. Furthermore, the sum of the area ratios of the plane orientations accounting for the first and second highest ranks was 66%, and the orientation of the crystal grain was high.

Using another crucible sample (Example B6b) manufactured under the same conditions as the crucible sample (Example B6a), a step of pulling a silicon single crystal by the CZ method was performed, and thereafter the degree of sagging of the crucible sample used was measured. As shown in Table 3, the degree of sagging at the upper end of the crucible was about 13 mm. In addition, the single crystal yield was 74%, which was a good result exceeding 70%. Furthermore, the crucible sample used was evaluated by the EBSD method. As shown in Table 3, the average grain size of the crystal grains was 0.53 μm, and the peak of the frequency distribution of the crystal grain sizes was 0.48 μm.

Next, the crucible sample used was evaluated by the X-ray diffraction method. The highest three ranks in the texture coefficients Tc of the plane orientations of the crystal layer were Tc(200) plane: 36.4%, Tc(202) plane: 34.9%, and Tc(112) plane: 9.2%. In addition, the Tc occupancy ratio of the first and second highest ranks was 71%, and it could be confirmed from the measurement results by the X-ray diffraction method that the orientation of the crystal grains was high.

Example B7

A crucible was manufactured under the application conditions of the crystallization accelerator different from those of Examples B1 to B6, and pulling of a silicon single crystal was performed using the crucible sample (Example B7a). The average particle size of the crystallization accelerator particles in the coating solution was 160 μm, the peak of the particle size frequency was 150 μm, the liquid viscosity of the solution was 50 mPa·s, and variation in the surface density of the crystallization accelerator was large. As a result, the degree of sagging of the crucible was about 10 mm. In addition, the single crystal yield was 75%, which was a good result exceeding 70%.

The crystal layer of the crucible sample used was evaluated by the EBSD method. The average grain size of the crystal grains was 0.89 μm, and the peak of the frequency distribution of the crystal grain sizes was 0.76 μm. In addition, the highest three ranks in the area ratios of the plane orientations were (200) plane: 34.5%, (112) plane: 36.6%, and (113) plane: 8.1%. Furthermore, the sum of the area ratios of the plane orientations accounting for the first and second highest ranks was 71%, and the orientation of the crystal grain was high.

Using another crucible sample (Example B7b) manufactured under the same conditions as the crucible sample (Example B7a), a step of pulling a silicon single crystal by the CZ method was performed, and thereafter the degree of sagging of the crucible sample used was measured. As shown in Table 3, the degree of sagging at the upper end of the crucible was about 14 mm. In addition, the single crystal yield was 73%, which was a good result exceeding 70%. Furthermore, the crucible sample used was evaluated by the EBSD method. As shown in Table 3, the average grain size of the crystal grains was 0.86 μm, and the peak of the frequency distribution of the crystal grain sizes was 0.81 μm.

Next, the crucible sample used was evaluated by the X-ray diffraction method. The highest three ranks in the texture coefficients Tc of the plane orientations of the crystal layer were Tc(200): 35.9%, Tc(112): 37.9%, and Tc(113): 7.8%. In addition, the Tc occupancy ratio of the first and second highest ranks was 74%, and it could be confirmed from the measurement results by the X-ray diffraction method that the orientation of the crystal grains was high.

Comparative Example B1

A crucible was manufactured under the application conditions of the crystallization accelerator different from those of Examples B1 to B7. Specifically, ultrasonic crushing of the crystallization accelerator was performed for a long period of time to make the particles fine, whereby a coating solution was produced. Therefore, the average particle size of the crystallization accelerator particles in the coating solution was 0.5 μm, and the peak of the particle size frequency was 0.5 μm. Thereafter, pulling of a silicon single crystal was performed using the crucible sample (Comparative Example B1a). As a result, the degree of sagging of the crucible was about 37 mm, which means that the degree of sagging was extremely large. In addition, the single crystal yield was 42%, which was a result significantly lower than 70%.

The crystal layer of the crucible sample used was evaluated by the EBSD method. The average grain size of the crystal grains was 0.07 μm, and the peak of the frequency distribution of the crystal grain sizes was 0.06 μm, which means that the crystal grain size was extremely small. In addition, the highest three ranks in the area ratios of the plane orientations were (200) plane: 26.1%, (112) plane: 25.2%, and (113) plane: 15.2%. Furthermore, the sum of the area ratios of the plane orientations accounting for the first and second highest ranks was 51%, and the orientation of the crystal grain was slightly high.

Using another crucible sample (Comparative Example B1b) manufactured under the same conditions as the crucible sample (Comparative Example B1a), a step of pulling a silicon single crystal by the CZ method was performed, and thereafter the degree of sagging of the crucible sample used was measured. As shown in Table 3, the degree of sagging at the upper end of the crucible was about 31 mm. In addition, the single crystal yield was 41%, which was a result lower than 70%. Furthermore, the crucible sample used was evaluated by the EBSD method. As shown in Table 3, the average grain size of the crystal grains was 0.08 μm, and the peak of the frequency distribution of the crystal grain sizes was 0.08 μm.

Next, the crucible sample used was evaluated by the X-ray diffraction method. The highest three ranks in the texture coefficients Tc of the plane orientations of the crystal layer were Tc(200): 26.7%, Tc(112): 26.1%, and Tc(113): 14.0%. In addition, the Tc occupancy ratio of the first and second highest ranks was 53%, and it could be confirmed from the measurement results by the X-ray diffraction method that the orientation of the crystal grains was slightly high.

Comparative Example B2

A crucible was manufactured under the application conditions of the crystallization accelerator different from those of Examples B1 to B7 and Comparative Example B1. Since ultrasonic crushing of the crystallization accelerator was not performed, the average particle size of the crystallization accelerator particles in the coating solution was 110 µm, and the peak of the particle size frequency was 150 µm. Thereafter, pulling of a silicon single crystal was performed using the crucible sample (Comparative Example B2a). As a result, the degree of sagging of the crucible was about 33 mm, which means that the degree of sagging was extremely large. In addition, the single crystal yield was 38%, which was a result significantly lower than 70%.

The crystal layer of the crucible sample used was evaluated by the EBSD method. The average grain size of the crystal grains was 110 µm, and the peak of the frequency distribution of the crystal grain sizes was 112 µm, which means that the crystal grain size was extremely large. In addition, the highest three ranks in the area ratios of the plane orientations were (200) plane: 31.8%, (112) plane: 28.0%, and (113) plane: 14.2%. Furthermore, the sum of the area ratios of the plane orientations accounting for the first and second highest ranks was 60%, and the orientation of the crystal grain was slightly high.

Using another crucible sample (Comparative Example B2b) manufactured under the same conditions as the crucible sample (Comparative Example B2a), a step of pulling a silicon single crystal by the CZ method was performed, and thereafter the degree of sagging of the crucible sample used was measured. As shown in Table 3, the degree of sagging at the upper end of the crucible was about 38 mm. In addition, the single crystal yield was 33%, which was a result lower than 70%. Furthermore, the crucible sample used was evaluated by the EBSD method. As shown in Table 3, the average grain size of the crystal grains was 108 µm, and the peak of the frequency distribution of the crystal grain sizes was 112 µm.

Next, the crucible sample used was evaluated by the X-ray diffraction method. The highest three ranks in the texture coefficients Tc of the plane orientations of the crystal layer were (200) plane: 28.2%, (112) plane: 26.8%, and (113) plane: 16.2%. In addition, the Tc occupancy ratio of the first and second highest ranks was 55%, and it could be confirmed from the measurement results by the X-ray diffraction method that the orientation of the crystal grains was slightly high.

REFERENCE SIGNS LIST 1, 2, 3 quartz glass crucible
4 polycrystalline silicon raw material
5 silicon melt
5a melt surface (initial melt surface position)
6 heater
8 carbon susceptor
10 quartz glass crucible body (crucible body)
10a side wall portion of crucible body
10b bottom portion of crucible body
10c corner portion of crucible body
10i inner surface of crucible body
10o outer surface of crucible body
10t rim upper-end surface of crucible body
11 transparent layer
12 opaque layer
13A inner-surface coating film
13B outer-surface coating film
14A inner crystal layer
14B outer crystal layer
15A uncoated region
15B uncoated region
16 deposition layer of raw material silica powder
16A natural silica powder
16B synthetic silica powder
20 strain measuring device
21 polarizing plate (polarizer)
22 polarizing plate (analyzer)
23 crucible piece
24 quarter-wave plate
25 light source
30 mold
30i inner surface of mold
31 arc electrode
32 vent hole
40 EBSD device
41 EBSD detector
42 sample
43 electron beam
Lc compressive stress layer
Lt tensile stress layer

What is claimed is:

1. A quartz glass crucible comprising:
a quartz glass crucible body having a cylindrical side wall portion, a curved bottom portion, and a corner portion which has a larger curvature than that of the bottom portion and connects the side wall portion and the bottom portion to each other; and
an outer-surface coating film which contains a crystallization accelerator and is formed on an outer surface of the quartz glass crucible body,
wherein the outer surface and an inner surface of the quartz glass crucible body are under compressive stress,
an average grain size of crystal grains contained in an outer crystal layer formed in a vicinity of the outer surface of the quartz glass crucible body due to an action of the outer-surface coating film heated during a step of pulling a silicon single crystal is 0.1 to 100 µm, and
a peak of a frequency distribution of the crystal grains is in a range of 0.1 to 100 µm,
wherein, when texture coefficients Tc of respective plane orientations of the outer crystal layer viewed from an outer surface side of the quartz glass crucible body is measured by an X-ray diffraction method, a ratio (Tc occupancy ratio) of first and second highest ranks in the texture coefficients Tc to a sum of the texture coefficients Tc of the respective plane orientations is 50% or more.

2. The quartz glass crucible according to claim 1,
wherein the outer-surface coating film contains a compound that contains the crystallization accelerator and forms a two-or-more-component glass using $SiO_2$.

3. The quartz glass crucible according to claim 1,
wherein an uncoated region of the crystallization accelerator is provided within a range of 2 to 40 mm extending downward from a rim upper end on the outer surface of the quartz glass crucible body.

4. The quartz glass crucible according to claim 1,
wherein a bubble content in a vicinity of the outer surface of the quartz glass crucible body is 0.8% or more and 5% or less.

5. The quartz glass crucible according to claim 1,
wherein an average particle size of the crystallization accelerator is 0.1 to 100 µm, and
a peak of a frequency distribution of particle sizes of the crystallization accelerator is in a range of 0.1 to 100 µm.

6. A quartz glass crucible comprising:

a quartz glass crucible body having a cylindrical side wall portion, a curved bottom portion, and a corner portion which has a larger curvature than that of the bottom portion and connects the side wall portion and the bottom portion to each other; and an outer-surface coating film which contains a crystallization accelerator and is formed on an outer surface of the quartz glass crucible body, wherein the outer surface and an inner surface of the quartz glass crucible body are under compressive stress, wherein an average grain size of crystal grains contained in an outer crystal layer formed in a vicinity of the outer surface of the quartz glass crucible body due to an action of the outer-surface coating film heated during a step of pulling a silicon single crystal is 0.1 to 100 μm, a peak of a frequency distribution of the crystal grains is in a range of 0.1 to 100 μm, and plane orientations of the outer crystal layer having first and second highest area occupancy ratios, among all plane orientations of the outer crystal layer, account for 50% or more of total area occupancy ratios of the all plane orientations as viewed from an outer surface side of the quartz glass crucible body.

7. The quartz glass crucible according to claim 6, wherein an average particle size of the crystallization accelerator is 0.1 to 100 μm, and a peak of a frequency distribution of particle sizes of the crystallization accelerator is in a range of 0.1 to 100 μm.

8. A quartz glass crucible comprising:

a quartz glass crucible body having a cylindrical side wall portion, a curved bottom portion, and a corner portion which has a larger curvature than that of the bottom portion and connects the side wall portion and the bottom portion to each other; and an outer-surface coating film which contains a crystallization accelerator and is formed on an outer surface of the quartz glass crucible body, wherein the outer surface and an inner surface of the quartz glass crucible body are under compressive stress, wherein an average grain size of crystal grains contained in an outer crystal layer formed in a vicinity of the outer surface of the quartz glass crucible body due to an action of the outer-surface coating film heated during a step of pulling a silicon single crystal is 0.1 to 100 μm, wherein, when texture coefficients Tc of respective plane orientations of the outer crystal layer viewed from an outer surface side of the quartz glass crucible body is measured by an X-ray diffraction method, a ratio (Tc occupancy ratio) of first and second highest ranks in the texture coefficients Tc to a sum of the texture coefficients Tc of the respective plane orientations is 50% or more.

9. The quartz glass crucible according to claim 8, wherein an average particle size of the crystallization accelerator is 0.1 to 100 μm, and a peak of a frequency distribution of particle sizes of the crystallization accelerator is in a range of 0.1 to 100 μm.

\* \* \* \* \*